United States Patent
Wu et al.

(10) Patent No.: US 11,031,407 B2
(45) Date of Patent: Jun. 8, 2021

(54) ANTI-FUSE DEVICE, CIRCUIT, METHODS, AND LAYOUT

(71) Applicant: TAIWAN SEMICONDUCTOR MANUFACTURING COMPANY LTD., Hsinchu (TW)

(72) Inventors: Min-Shin Wu, Taipei (TW);
Meng-Sheng Chang, Chubei (TW);
Shao-Yu Chou, Chu Pei (TW);
Yao-Jen Yang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/460,266

(22) Filed: Jul. 2, 2019

(65) Prior Publication Data
US 2020/0075610 A1    Mar. 5, 2020

Related U.S. Application Data

(60) Provisional application No. 62/725,192, filed on Aug. 30, 2018.

(51) Int. Cl.
*G11C 17/00* (2006.01)
*H01L 27/112* (2006.01)
*G11C 17/18* (2006.01)
*G11C 17/16* (2006.01)

(52) U.S. Cl.
CPC ........ *H01L 27/11206* (2013.01); *G11C 17/16* (2013.01); *G11C 17/18* (2013.01)

(58) Field of Classification Search
CPC ....... G11C 17/16; G11C 17/18; G11C 11/412; G11C 16/0475; G11C 11/417; G11C 11/418; G11C 11/419; G11C 7/02; G11C 8/16; H01L 27/112; H01L 23/525; H01L 27/10; H01L 29/423; H01L 23/5252; H01L 27/11206; H01L 23/528; H01L 28/20; H01L 29/66545; H01L 29/7848; H01L 21/823431; H01L 29/165; H01L 29/0847; H01L 29/785; H01L 21/823418;
(Continued)

(56) References Cited

U.S. PATENT DOCUMENTS

| 7,260,442 B2 | 8/2007 | Hwang et al. |
| 9,256,709 B2 | 2/2016 | Yu et al. |
| 10,014,066 B2 * | 7/2018 | Liaw ............ H01L 27/112 |

(Continued)

FOREIGN PATENT DOCUMENTS

KR    20160032478    3/2016

OTHER PUBLICATIONS

Office Action dated Jul. 31, 2020 from corresponding application No. KR 10-2019-0106595.
(Continued)

*Primary Examiner* — Thong Q Le
(74) *Attorney, Agent, or Firm* — Hauptman Ham, LLP

(57) ABSTRACT

An IC device includes an anti-fuse device including a dielectric layer between a first gate structure and an active area, a first transistor including a second gate structure overlying the active area, and a second transistor including a third gate structure overlying the active area. The first gate structure is between the second gate structure and the third gate structure.

20 Claims, 17 Drawing Sheets

(58) Field of Classification Search
CPC ........... H01L 27/088; H01L 21/823481; H01L 29/66795; H01L 21/823821; H01L 27/0207
USPC .... 365/185.27, 185.33, 51, 63, 72; 257/368, 257/E29.264, 355, 369, E21.219, 257/E21.421, E21.423, E21.437, E27.06, 257/E29.309, 288, 316, 319, 324, 326, 257/371, 408, 797
See application file for complete search history.

(56) References Cited

U.S. PATENT DOCUMENTS

| | | |
|---|---|---|
| 2014/0040838 A1 | 2/2014 | Liu et al. |
| 2015/0278429 A1 | 10/2015 | Chang |
| 2016/0078962 A1 | 3/2016 | Park |
| 2018/0166382 A1* | 6/2018 | Lee ................. H01L 27/101 |
| 2018/0212058 A1 | 7/2018 | Toh et al. |

OTHER PUBLICATIONS

Office Action dated Feb. 16, 2021 for corresponding case No. 10 2019 118 095.3. (pp. 1-10).

* cited by examiner

400

410 Form an anti-fuse device including first and second S/D structures

420 Form a first transistor including the first S/D structure and a second transistor including the second S/D structure

430 Construct an electrical connection between gates of the first and second transistors

440 Construct an electrical connection between a third S/D structure of the first transistor and a fourth S/D structure of the second transistor

FIG. 4

ANTI-FUSE DEVICE, CIRCUIT, METHODS, AND LAYOUT

PRIORITY CLAIM

The present application claims the priority of U.S. Provisional Application No. 62/725,192, filed Aug. 30, 2018, which is incorporated herein by reference in its entirety.

BACKGROUND

Integrated circuits (ICs) sometimes include one-time-programmable ("OTP") memory elements to provide non-volatile memory ("NVM") in which data are not lost when the IC is powered off. One type of NVM includes an anti-fuse bit integrated into an IC by using a layer of dielectric material (oxide, etc.) connected to other circuit elements. To program an anti-fuse bit, a programming electric field is applied across the dielectric material layer to sustainably alter (e.g., break down) the dielectric material, thus decreasing the resistance of the dielectric material layer. Typically, to determine the status of an anti-fuse bit, a read voltage is applied across the dielectric material layer and a resultant current is read.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 is a flowchart of a method of manufacturing an anti-fuse device, in accordance with some embodiments.

DETAILED DESCRIPTION

Figure 1A:
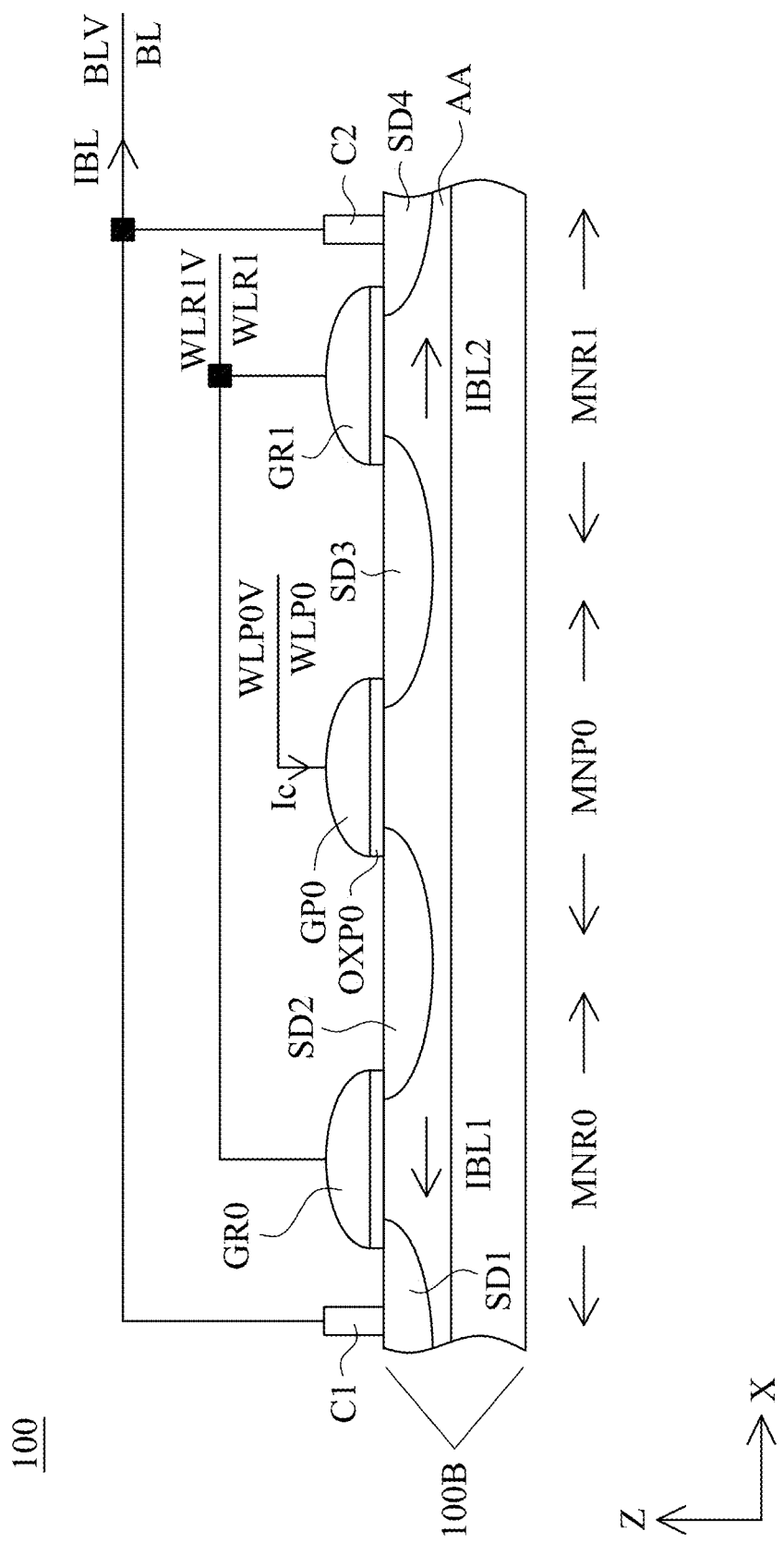
FIGS. 1A-1F are diagrams of an anti-fuse device, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, an anti-fuse cell includes an anti-fuse device and two selection transistors configured to collectively couple the anti-fuse device to a bit line. In programming operations, the combination of the two transistors enables a more uniform electric field application than in approaches in which a single transistor couples an anti-fuse device to a bit line. In read operations, the resultant parallel current paths enable lower path resistance, reduced effects of device resistance variations, and increased current compared to approaches in which a single transistor couples an anti-fuse device to a bit line, thereby improving accuracy when detecting programmed status.

FIGS. 1A-1F are diagrams of an IC device 100, in accordance with some embodiments. In some embodiments, IC device 100 is formed by executing some or all of the operations of method 400 and/or method 500 and/or is configured based on an IC layout diagram 600A or 600B, discussed below with respect to FIGS. 4-6B. In some embodiments, IC device 100 is included in an IC device 860 manufactured by an IC manufacturer/fabricator ("fab") 850, discussed below with respect to FIG. 8.

Figure 1B:
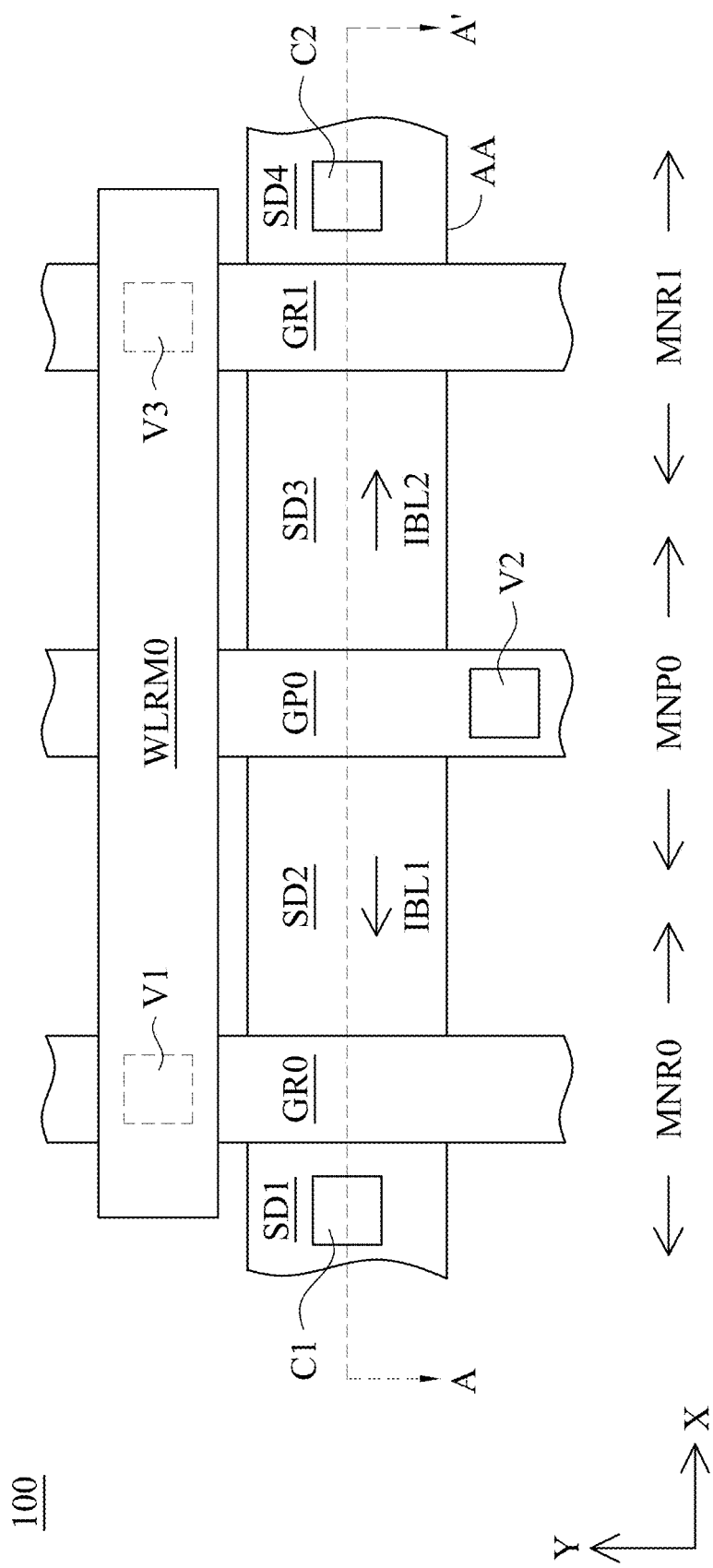
Figure 1C:
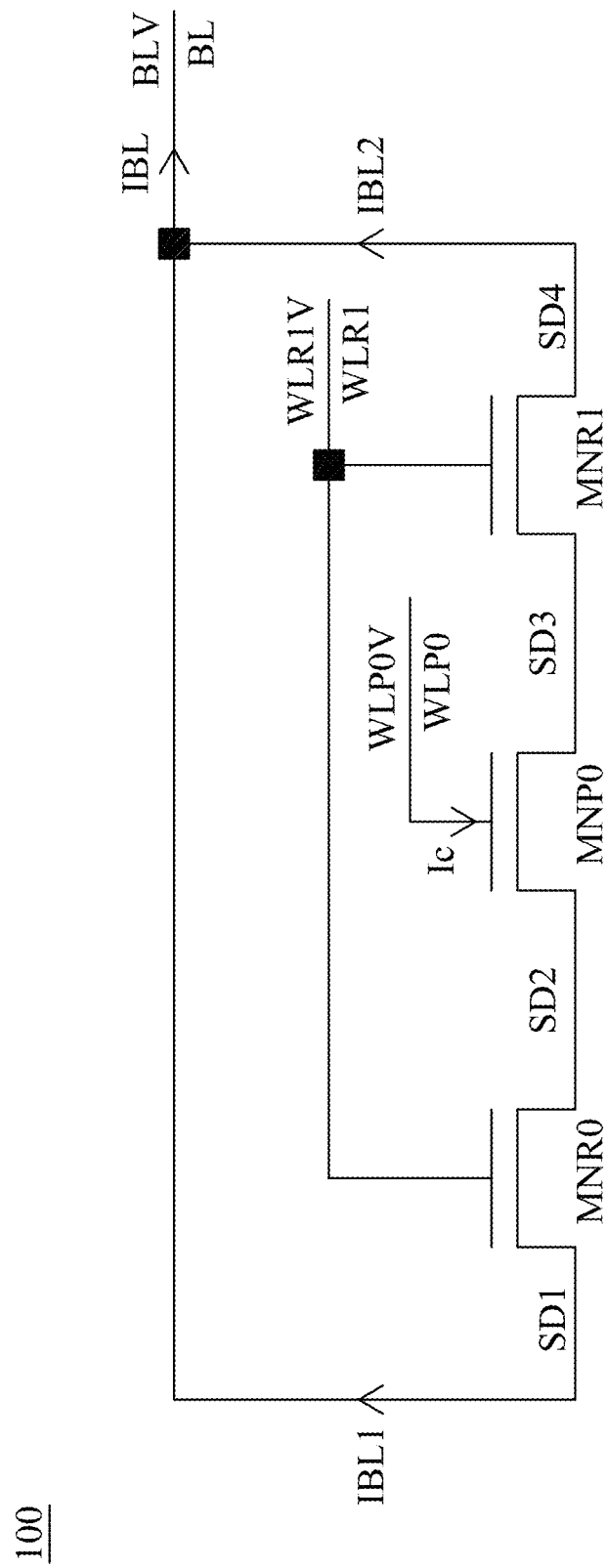
Figure 1D:
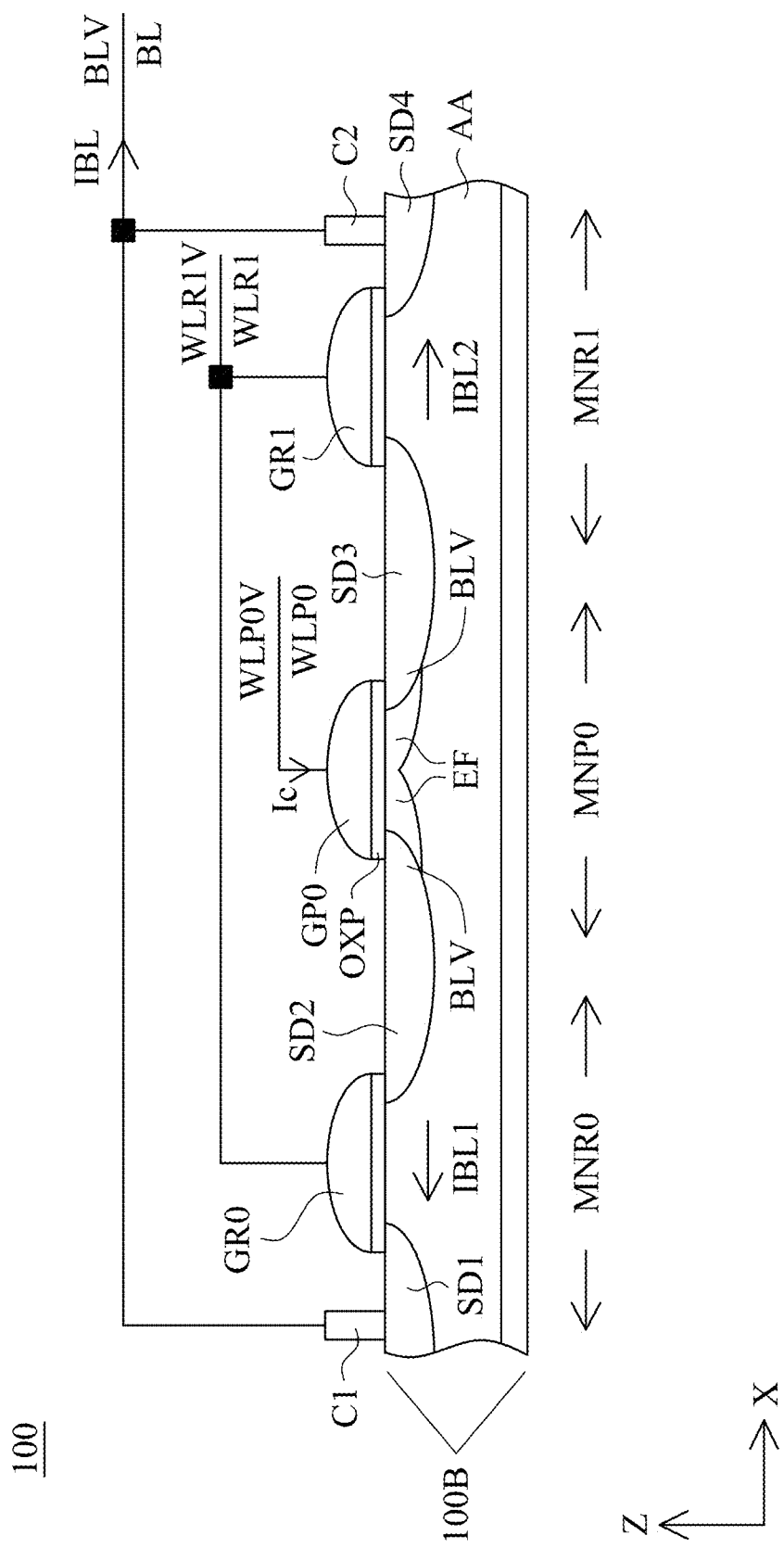
Figure 1E:
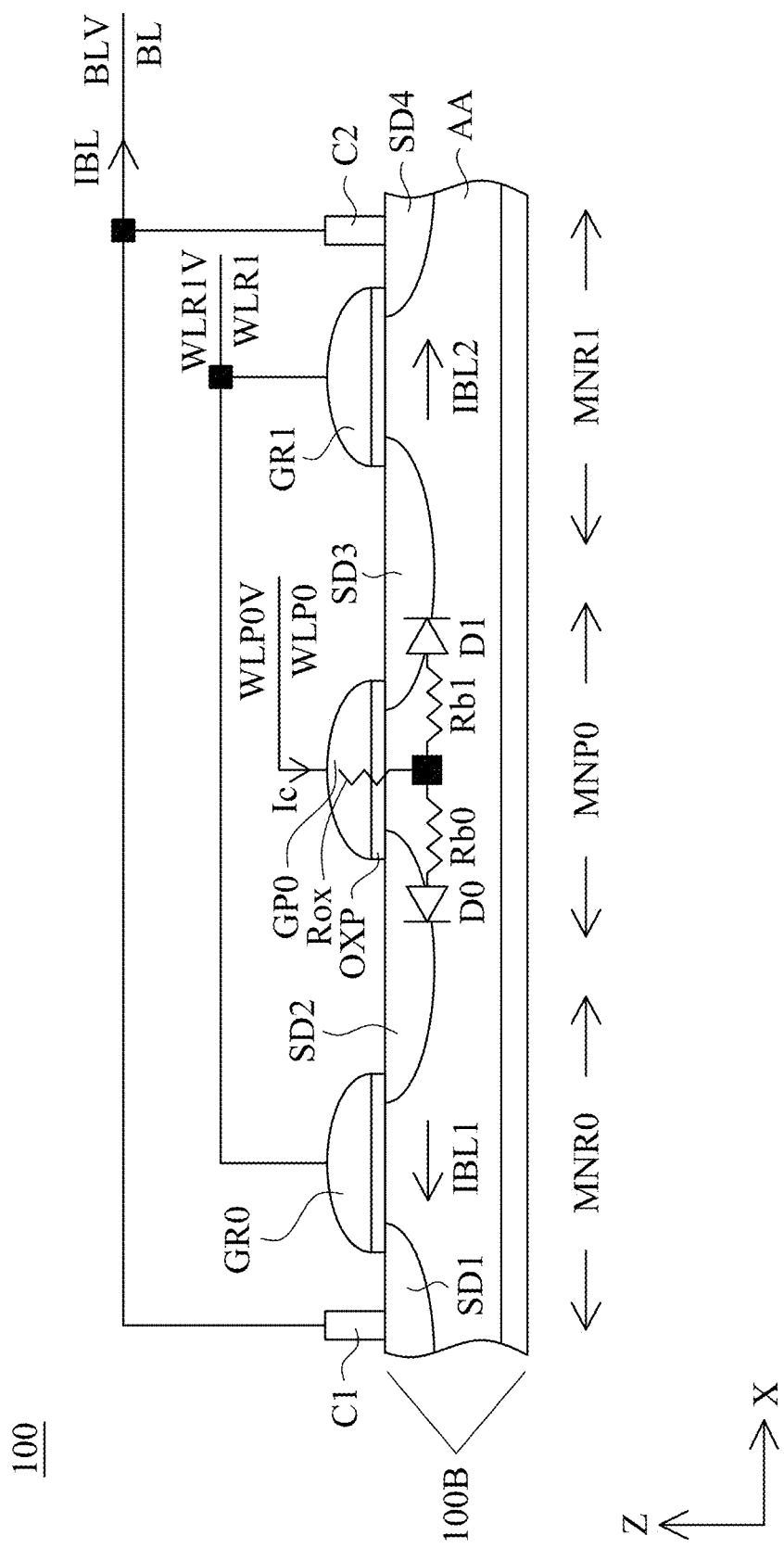
Figure 1F:
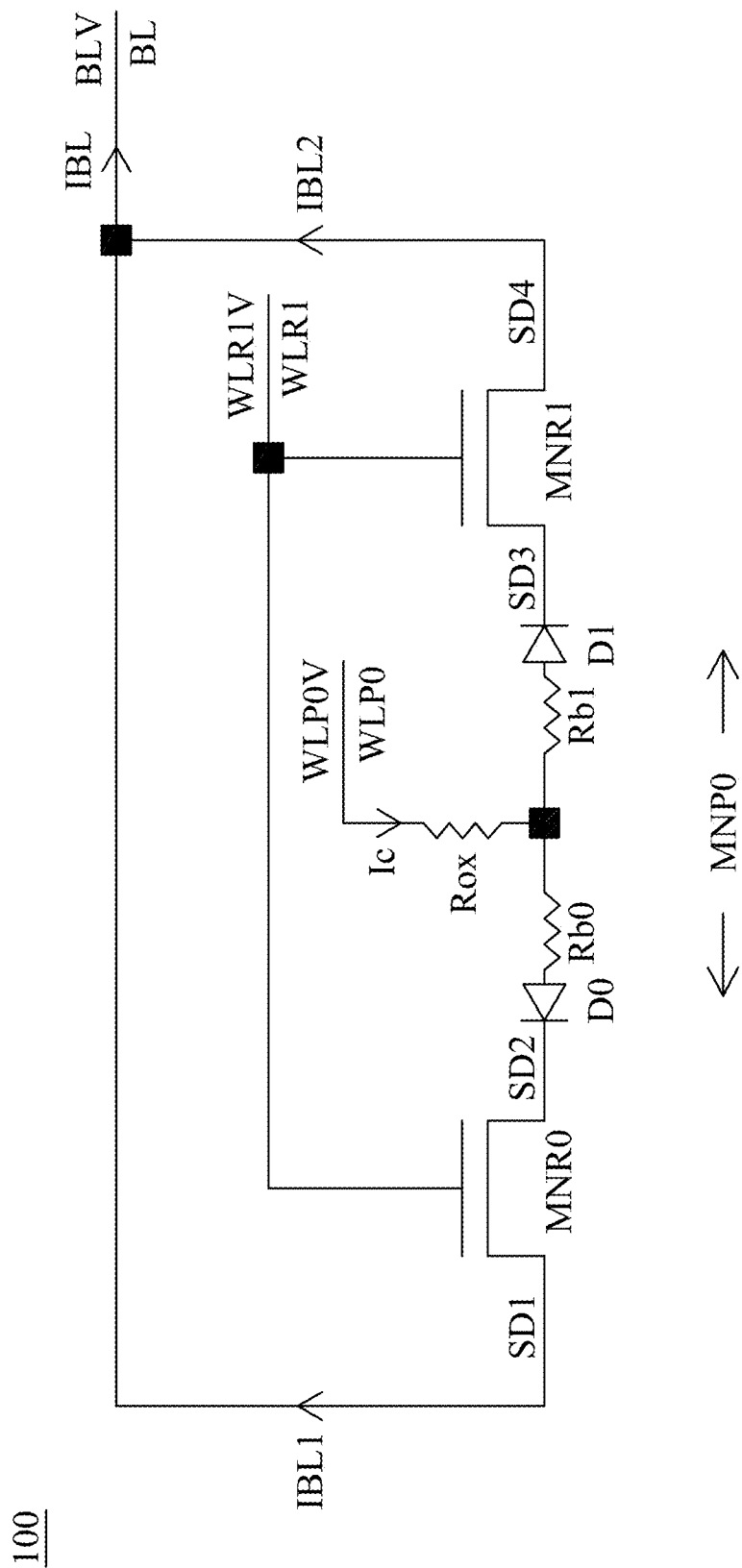

FIGS. 1A, 1D, and 1E depict cross-sectional views of IC device 100 along a plane A-A' including X and Z directions, and FIG. 1B depicts a plan view of IC device 100, the X direction and a Y direction, and an intersection with plane A-A' along the X direction. FIG. 1C is a schematic representation of IC device 100 in an un-programmed state as depicted in FIGS. 1A and 1D, and FIG. 1F is a schematic representation of IC device 100 in a programmed state as depicted in FIG. 1E.

Each of FIGS. 1A-1F depicts currents IBL1 and IBL2 generated in response to an applied voltage during operation of IC device 100. FIG. 1D further depicts an electric field EF generated in response to an applied voltage during operation of IC device 100 in an un-programmed state.

The depictions of IC device 100 in FIGS. 1A-1F are simplified for the purpose of clarity. FIGS. 1A, 1B, 1D, and 1E depict views of IC device 100 with various features included and excluded to facilitate the discussion below. In various embodiments, IC device 100 includes one or more metal interconnects, contacts, vias, gate structure or other transistor elements, wells, isolation structures, or the like, in addition to the elements depicted in FIGS. 1A, 1B, 1D, and 1E.

As depicted in FIGS. 1A-1F, IC device 100 includes a transistor MNR0, an anti-fuse device MNP0, and a transistor MNR1 formed in a substrate 100B. Substrate 100B is a portion of a semiconductor wafer, e.g., a semiconductor wafer 853 discussed below with respect to FIG. 8, suitable for forming one or more IC devices, e.g., IC device 100. In various embodiments, substrate 100B includes n-type silicon or p-type silicon.

Substrate 100B includes an active area AA in which a lower portion of IC device 100 is located. Active area AA is a continuous section of substrate 100B having either n-type or p-type doping that includes various semiconductor structures, including source-drain (S/D) structures SD1-SD4. In some embodiments, active area AA is located within a well (not shown), i.e., either an n-well or a p-well, within substrate 100B.

In some embodiments, active area AA is electrically isolated from other elements in substrate 100B by one or more isolation structures (not shown), e.g., one or more shallow trench isolation (STI) structures.

S/D structures SD1-SD4 are semiconductor structures configured to have a doping type opposite to that of other portions of active area AA. In the embodiment depicted in FIGS. 1A-1F, active area AA has p-type doping and S/D structures SD1-SD4 have n-type doping, indicated as diodes D1 and D2 in FIGS. 1E and 1F.

In some embodiments, S/D structures are configured to have lower resistivity than other portions of active area AA. In some embodiments, S/D structures SD1-SD4 include one or more portions having doping concentrations greater than one or more doping concentrations otherwise present throughout active area AA. In various embodiments, S/D structures SD1-SD4 include epitaxial regions of a semiconductor material, e.g., silicon, silicon-germanium (SiGe), and/or silicon-carbide (SiC).

Transistor MNR0 includes at least a portion of S/D structure SD1, a portion of S/D structure SD2, and a portion of active area AA between S/D structures SD1 and SD2; anti-fuse device MNP0 includes a portion of S/D structure SD2, a portion of S/D structure SD3, and a portion of active area AA between S/D structures SD2 and SD3; and transistor MNR1 includes a portion of S/D structure SD3, at least a portion of S/D structure SD4, and a portion of active area AA between S/D structures SD3 and SD4. Anti-fuse device MNP0 thereby shares S/D structure SD2 with transistor MNR0 and shares S/D structure SD3 with transistor MNR1. In various embodiments, transistor MNR0 shares S/D structure SD1 with at least one other IC device (not shown) and/or transistor MNR1 shares S/D structure SD4 with at least one other IC device (not shown).

Transistor MNR0 includes a gate structure GR0 overlying a dielectric layer (not labeled) and portions of each of S/D structures SD1 and SD2 along the Z direction. The portion of active area AA directly below gate structure GR0 and between S/D structures SD1 and SD2 is thereby configured as a channel (not shown) of transistor MNR0. In various embodiments, gate structure GR0 extends in the positive and/or negative Y direction and is included in one or more transistors (not shown) in addition to transistor MNR0.

Transistor MNR1 includes a gate structure GR1 overlying a dielectric layer (not labeled) and portions of each of S/D structures SD3 and SD4 along the Z direction. The portion of active area AA directly below gate structure GR1 and between S/D structures SD3 and SD4 is thereby configured as a channel (not shown) of transistor MNR1. In various embodiments, gate structure GR1 extends in the positive and/or negative Y direction and is included in one or more transistors (not shown) in addition to transistor MNR1.

Anti-fuse device MNP0 includes a gate structure GP0 overlying a dielectric layer OXP and portions of each of S/D structures SD2 and SD3 along the Z direction. S/D structures SD2 and SD3 are thereby configured to control voltage levels of the portion of active area AA directly below gate structure GP0 and dielectric layer OXP, and between S/D structures SD2 and SD3. In various embodiments, gate structure GP0 extends in the positive and/or negative Y direction and is included in one or more anti-fuse devices (not shown) in addition to anti-fuse device MNP0.

Each of gate structures GR0, GR1, and GP0 is a volume including one or more conductive materials, e.g., polysilicon, one or more metals, and/or one or more other suitable materials, substantially surrounded by one or more insulating materials, e.g., silicon dioxide and/or one or more other suitable materials, and is thereby configured to control a voltage provided to an underlying dielectric layer, e.g., dielectric layer OXP, of IC device 100.

Dielectric layer OXP includes a layer of one or more dielectric materials configured so that, in operation, a sufficiently large electric field across the dielectric layer sustainably alters at least one of the dielectric materials, thereby significantly decreasing the resistance of the dielectric layer from a level prior to application of the electric field. Sustainably altering the dielectric material is also referred to as breaking down the dielectric material or as programming anti-fuse device MNP0 and/or IC device 100, in some embodiments.

In various embodiments, dielectric layer OXP includes one or more of silicon dioxide and/or a high-k dielectric material, e.g., a dielectric material having a k value higher than 3.8 or 7.0. In some embodiments, a high-k dielectric material includes aluminum oxide, hafnium oxide, lanthanum oxide, or another suitable material.

IC device 100 includes a via structure V2 overlying and electrically connected to gate structure GP0. A via structure, e.g., via structure V2, is one or more conductive elements configured to electrically connect an underlying structure, e.g., gate structure GP0, to an overlying conductive path, e.g., a conductive path WLP0 (not shown in FIG. 1B). Via structure V2 is depicted in FIG. 1B, and is included in the schematic representation of conductive path WLP0 depicted in FIGS. 1A 1C-1F.

A conductive path, e.g., conductive path WLP0, is one or more conductive elements configured to provide a low-resistance electrical connection between first and second circuit elements. In various embodiments, conductive elements, also referred to as conductors, are IC structures including one or more conductive materials, e.g., copper, tungsten, aluminum, gold, titanium, polysilicon, or other materials suitable for forming a low resistance path. In some embodiments, a conductive element is a segment of a metal zero layer of a manufacturing process used to form IC device 100.

Conductive path WLP0, also referred to as a conductive or bias voltage line in some embodiments, is configured as at least part of a low-resistance electrical connection between via structure V2 and a first voltage source (not shown) external to IC device 100 and configured to provide a voltage WLP0V, also referred to as a signal in some embodiments. Gate structure GP0 of anti-fuse device MNP0 is thereby electrically connected to conductive path WLP0 through via structure V2, and anti-fuse device MNP0 is thereby configured to receive voltage WLP0V from the first voltage source in operation.

IC device 100 includes a via structure V1 overlying and electrically connected to gate structure GR0, a via structure V3 overlying and electrically connected to gate structure GR1, and a conductive element WLRM0 overlying and electrically connected to each of via structures V1 and V3.

Conductive element WLRM0 is part of a conductive path WLR1. Via structures V1 and V3 and conductive element WLRM0 are depicted in FIG. 1B, and are included in the schematic representation of conductive path WLR1 depicted in FIGS. 1A 1C-1F.

In the embodiment depicted in FIG. 1B, via structures V1 and V3 are configured to electrically connect respective gate structures GR0 and GR1 to conductive path WLR1 through the single conductive element WLRM0, and thereby couple gate structures GR0 and GR1 to each other. In some embodiments, via structures V1 and V3 are configured to electrically connect respective gate structures GR0 and GR1 to conductive path WLR1, and thereby couple gate structures GR0 and GR1 to each other through one or more conductive elements in addition to or instead of conductive element WLRM0.

Conductive path WLR1, also referred to as a selection signal line in some embodiments, is configured to electrically connect gate structures GR0 and GR1 to a second voltage source (not shown) external to IC device 100 and configured to provide a voltage WLR1V. Gate structures GR0 and GR1 of respective transistors MNR0 and MNR1 are thereby electrically connected to conductive path WLR1 through respective via structures V1 and V3, and each of transistors MNR0 and MNR1 is thereby configured to receive voltage WLR1V from the second voltage source in operation.

IC device 100 includes a contact structure C1 overlying and electrically connected to S/D structure SD1. A contact structure, e.g., contact structure C1, is one or more conductive elements configured to electrically connect a substrate structure, e.g., S/D structure SD1, in an active area, e.g., active area AA, to an overlying conductive path, e.g., a conductive path BL.

Conductive path BL, also referred to as a bit line in some embodiments, is represented schematically in FIGS. 1A and 1C-1F and is configured to electrically connect contact structure C1 to a third voltage source (not shown) external to IC device 100 and configured to provide a voltage BLV. S/D structure SD1 of transistor MNR0 is thereby electrically connected to conductive path BL, and IC device 100 is thereby configured to receive voltage BLV from the third voltage source in operation.

IC device 100 includes a contact structure C2 overlying and electrically connected to S/D structure SD4, and electrically connected to overlying conductive path BL. S/D structure SD4 of transistor MNR1 is thereby electrically connected to conductive path BL, and IC device 100 is thereby configured to receive voltage BLV from the third voltage source in operation.

In some embodiments, contact structures C1 and C2 are electrically connected to a same conductive element of conductive path BL, and S/D structures SD1 and SD4 are thereby configured to receive voltage BLV from conductive path BL through respective contact structures C1 and C2. In some embodiments, contact structures C1 and C2 are electrically connected to separate conductive elements of conductive path BL, and S/D structures SD1 and SD4 are otherwise configured to receive voltage BLV from conductive path BL through respective contact structures C1 and C2.

In operation, transistors MNR0 and MNR1 are thereby configured to be simultaneously switched on or off responsive to voltage WLR1V received at respective gate structures GR0 and GR1 and voltage BLV received at respective S/D structures SD1 and SD4. In the embodiment depicted in FIGS. 1A-1F, each of transistors MNR0 and MNR1 is an n-type transistor and is switched on in response to a value of voltage WLR1V above a value of voltage BLV by an amount equal to or greater than a threshold voltage of the corresponding one of transistor MNR0 or MNR1.

In some embodiments, each of transistors MNR0 and MNR1 is a p-type transistor and is switched on in response to a value of voltage WLR1V below a value of voltage BLV by an amount equal to or greater than a threshold voltage of the corresponding one of transistor MNR0 or MNR1. In various embodiments, the threshold voltages of transistors MNR0 and MNR1 are a same voltage value or have values that differ from each other.

By the configuration of IC device 100 discussed above, anti-fuse device MNP0 and transistor MNR0 are coupled in series between conduction paths WLP0 and BL, and anti-fuse device MNP0 and transistor MNR1 are coupled in series between conduction paths WLP0 and BL. Transistor MNR0 is coupled to a first terminal of anti-fuse device MNP0 at S/D structure SD2, and transistor MNR1 is coupled to a second terminal of anti-fuse device MNP0 at S/D structure SD3. Transistors MNR0 and MNR1 are thereby configured in parallel, each of transistors MNR0 and MNR1 being coupled between anti-fuse device MNP0 and conductive path BL.

In operation, transistor MNR0 being switched on causes the corresponding channel to become conductive, thereby allowing voltage BLV to be transferred from S/D structure SD1 to S/D structure SD2 and allowing current IBL1 to flow from S/D structure SD2 to S/D structure SD1 through the low resistance path of the channel. Transistor MNR1 being switched on causes the corresponding channel to become conductive, thereby allowing voltage BLV to be transferred from S/D structure SD4 to S/D structure SD3 and allowing current IBL2 to flow from S/D structure SD3 to S/D structure SD4 through the low resistance path of the channel.

In operation, when transistors MNR0 and MNR1 are switched on, voltage WLP0V at gate structure GP0 causes a current Ic to flow through dielectric layer OXP. A magnitude and polarity of current Ic are determined based on a magnitude and polarity of the difference between the values of voltages WLP0V and BLV. In the embodiment depicted in FIGS. 1A-1F, a positive value of current Ic represents voltage WLP0V having a value greater than that of voltage BLV.

Current IBL1 is a first component of current Ic and flows from anti-fuse device MNP0 to S/D structure SD1 in the negative X direction. Current IBL2 is a second component of current Ic and flows from anti-fuse device MNP0 to S/D structure SD4 in the positive X direction. A sum of currents IBL1 and IBL2 is equal to current Ic and to a current IBL in conductive path BL.

Relative magnitudes of currents IBL1 and IBL2 are based on resistance values of the corresponding current paths between gate structure GP0 and conductive path BL. Based on the configuration discussed above, IC device 100 includes parallel current paths through which currents IBL1 and IBL2 flow, and current IBL is based on the total current through the two current paths. In operation, IC device 100 is thereby configured such that transistors MNR0 and MNR1 simultaneously couple anti-fuse device MNP0 to conduction path BL.

Compared to approaches in which a single transistor couples an anti-fuse device to a bit line through a single current path, IC device 100 enables an increased current during read operations, thereby improving the ability to detect a programmed status of an anti-fuse device, e.g., anti-fuse device MNP0. The improved ability is most pronounced in cases in which an anti-fuse device has been weakly programmed, i.e., has a large resistance value relative to a resistance value of a strongly programmed anti-fuse device.

FIG. 1D depicts an operation in which voltages WLP0V and BLV are applied to IC device 100 in an un-programmed state, as represented schematically in FIG. 1C. In the unprogrammed state, dielectric layer OXP of anti-fuse device MNP0 has a large resistance value relative to the programmed state such that current Ic, and therefore voltage drops corresponding to currents IBL1 and IBL2, are small enough to be ignored in the operation.

Accordingly, as illustrated in FIG. 1D, voltage BLV received at S/D structure SD1 is considered to be received at S/D structure SD2 via switched-on transistor MNR0, and voltage BLV received at S/D structure SD4 is considered to be received at S/D structure SD3 via switched-on transistor MNR1 in operation. In response to the difference between the values of voltage VLP0V at gate structure GP0 and voltage BLV at S/D structures SD2 and SD3, an overall electric field is generated in anti-fuse device MNP0, a portion of which is in active area AA and is represented in FIG. 1D as electric field EF.

In the embodiment depicted in FIG. 1D, because transistors MNR0 and MNR1 are symmetrically configured along the X direction with respect to anti-fuse device MNP0, in operation, voltage BLV at S/D structures SD2 and SD3 causes electric field EF to have a symmetric profile between S/D structures SD2 and SD3.

As depicted in FIG. 1D, the symmetric profile of electric field EF includes a first field strength at each of S/D structures SD2 and SD3, and a second field strength at a center of the portion of active area AA between S/D structures SD2 and SD3 and directly below gate structure GP0, the second field strength being lower than the first field strength.

In some embodiments, transistors MNR0 and MNR1 are not symmetrically configured along the X direction with respect to anti-fuse device MNP0 and, in operation, voltage BLV at S/D structures SD2 and SD3 causes electric field EF to have a non-symmetric profile between S/D structures SD2 and SD3 that otherwise varies between one or two field strengths at S/D structures SD2 and SD3 and a lower field strength at a point between S/D structures SD2 and SD3.

In approaches in which a single transistor is used to apply a voltage to an un-programmed anti-fuse device, the resultant electric field has a non-symmetric profile in which a field strength adjacent to the transistor continues to decrease as a distance from the transistor increases. Compared to such single transistor approaches, IC device 100 is configured as discussed above to apply a more uniform electric field across dielectric layer OXP in operation.

During a programming operation, a location at which a dielectric breakdown occurs is a function of the strengths of both the dielectric material and the electric field throughout the dielectric layer. By improving the uniformity of the electric field, IC device 100 increases a number of locations at which dielectric breakdown potentially occurs compared to single transistor approaches. In applications in which IC device 100 is part of an anti-fuse array, the increase in potential dielectric breakdown locations lowers an average resistance value of programmed devices and reduces a number of devices weakly programmed to resistance values substantially above the average, compared to single transistor approaches.

FIG. 1E depicts an operation in which voltages WLP0V and BLV are applied to IC device 100 in a programmed state, as represented schematically in FIG. 1F. In the programmed state, dielectric layer OXP of anti-fuse device MNP0 has a small resistance value relative to the un-programmed state and is represented as a resistor Rox at an arbitrary location within dielectric layer OXP. A resistor Rb0 represents a substrate resistance value between resistor Rox and S/D structure SD2, a resistor Rb1 represents a substrate resistance value between resistor Rox and S/D structure SD3, a diode D0 represents a junction between active area AA and S/D structure SD2, and a diode D1 represents a junction between active area AA and S/D structure SD3.

Resistor Rb0 and diode D0 coupled in series between resistor Rox and transistor MNR0 are thereby configured as a first current path in which current IBL1 flows in operation. Resistor Rb1 and diode D1 coupled in series between resistor Rox and transistor MNR1 are thereby configured as a second current path in which current IBL2 flows in operation. The first and second current paths are arranged in parallel such that, in operation, the total current IBL is a function of the parallel combination of resistors Rb0 and Rb1 in addition to the difference between voltages WLP0V and BLV relative to voltage drops across diodes D0 and D1.

In a case in which resistor Rox corresponds to a dielectric breakdown in the center of dielectric layer OXP along the X direction, resistors Rb0 and Rb1 have a same resistance value equal to approximately half of a total resistance value of active area AA between S/D structures SD2 and SD3. In this case, the parallel combination of resistors Rb0 and Rb1 has an equivalent resistance value equal to approximately one quarter of the total resistance value. In some embodiments, the center of dielectric layer OXP along the X direction corresponds to a midpoint between S/D structures SD2 and SD3.

In cases in which resistor Rox corresponds to a dielectric breakdown in dielectric layer OXP at a location other than the center along the X direction, one of resistors Rb0 or Rb1 has a resistance value equal to less than half of the total resistance value, and the parallel combination of resistors Rb0 and Rb1 has an equivalent resistance value less than one quarter of the total resistance value.

Thus, in the programmed state, a maximum equivalent substrate resistance of the parallel current path configuration of IC device 100 is approximately one quarter of the total resistance value of active area AA between S/D structures SD2 and SD3.

In approaches in which a single transistor is used to apply a voltage to a programmed anti-fuse device, the resultant single current path has a resistance value that can vary from less than one quarter of a total substrate resistance to a value approaching an entirety of the total substrate resistance depending on a location of a dielectric breakdown. Compared to such single transistor approaches, IC device 100 is configured as discussed above to achieve a lower average substrate resistance value and thereby a more uniform distribution of substrate resistance values in applications in which IC device 100 is part of an anti-fuse array. In read operations, the relatively lower and less variable substrate resistance values cause read currents to be relatively higher and less variable, and thereby more easily distinguished, compared to single transistor approaches.

Figure 2A:
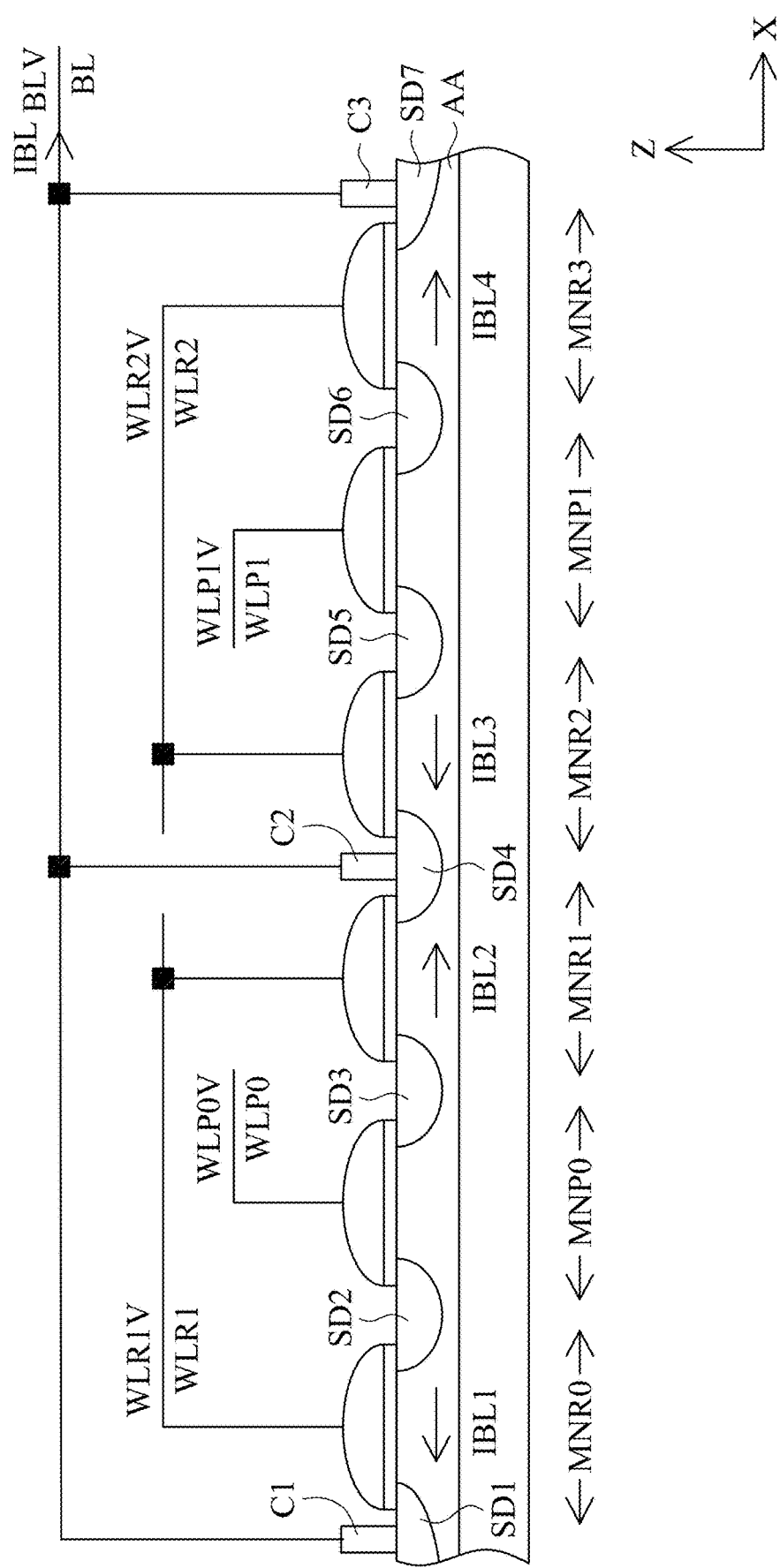
FIGS. 2A-2D are diagrams of an anti-fuse device, in accordance with some embodiments.
Figure 2B:
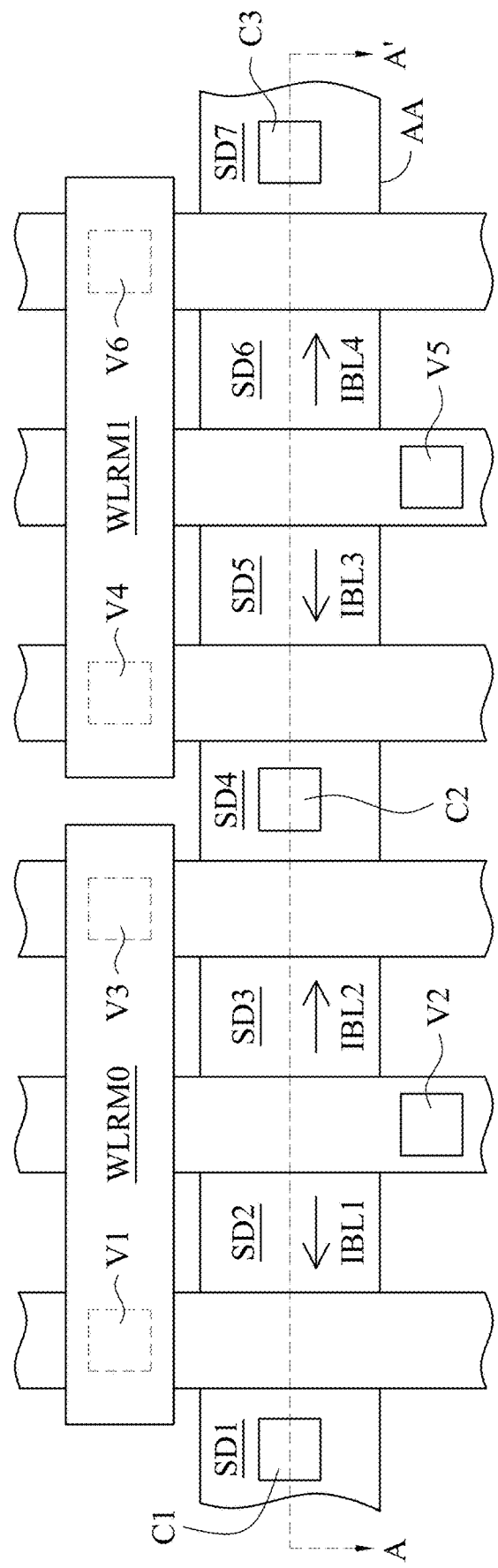
Figure 2C:
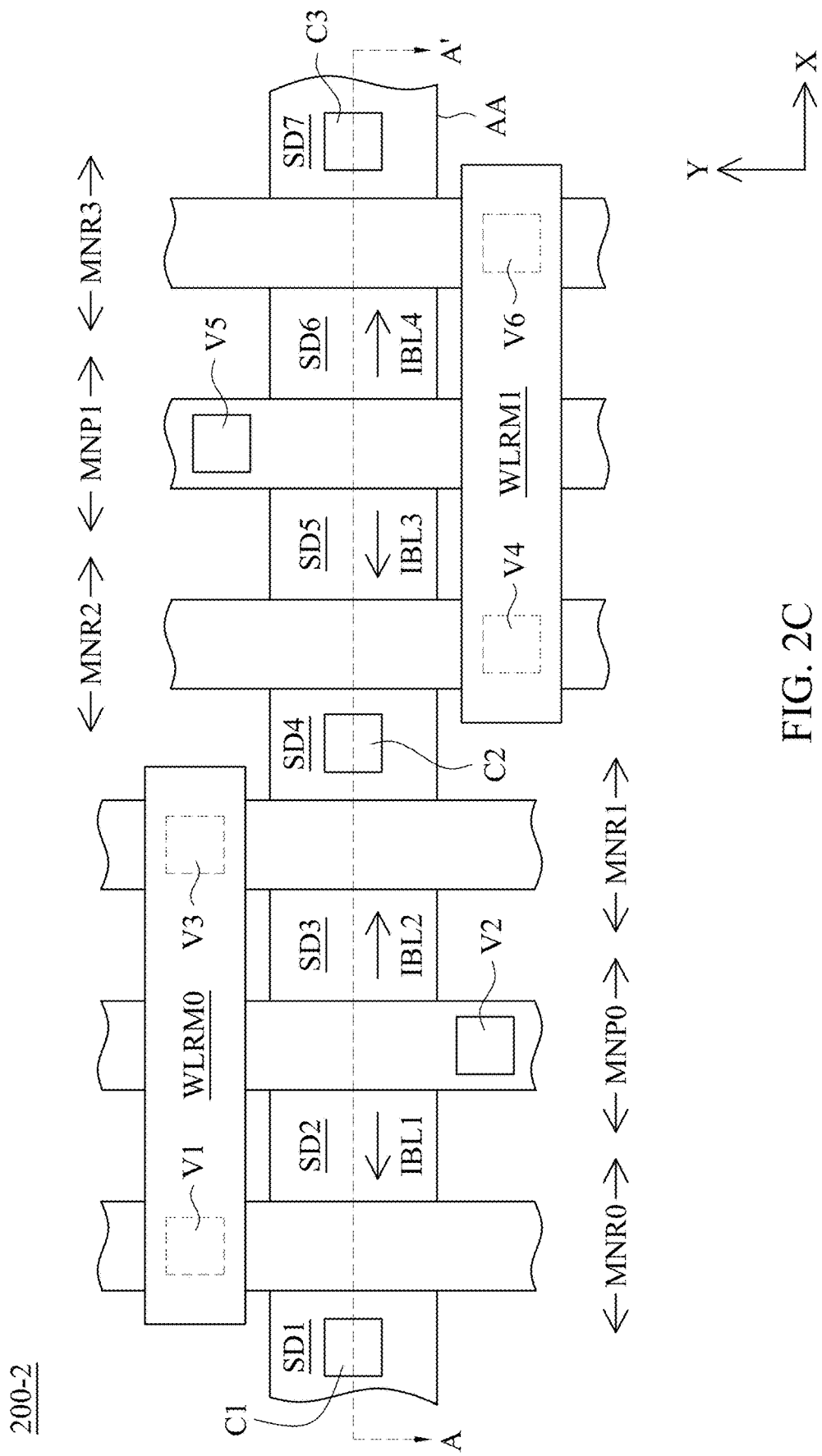

FIGS. 2A-2C are diagrams of an IC device 200, in accordance with some embodiments. In some embodiments, IC device 200 is formed by executing some or all of the operations of method 400 and/or method 500 and/or is configured based on an IC layout diagram 600A or 600B, discussed below with respect to FIGS. 4-6B. In some embodiments, IC device 200 is included in an IC device 860 manufactured by an IC manufacturer/fabricator ("fab") 850, discussed below with respect to FIG. 8.

Figure 2D:
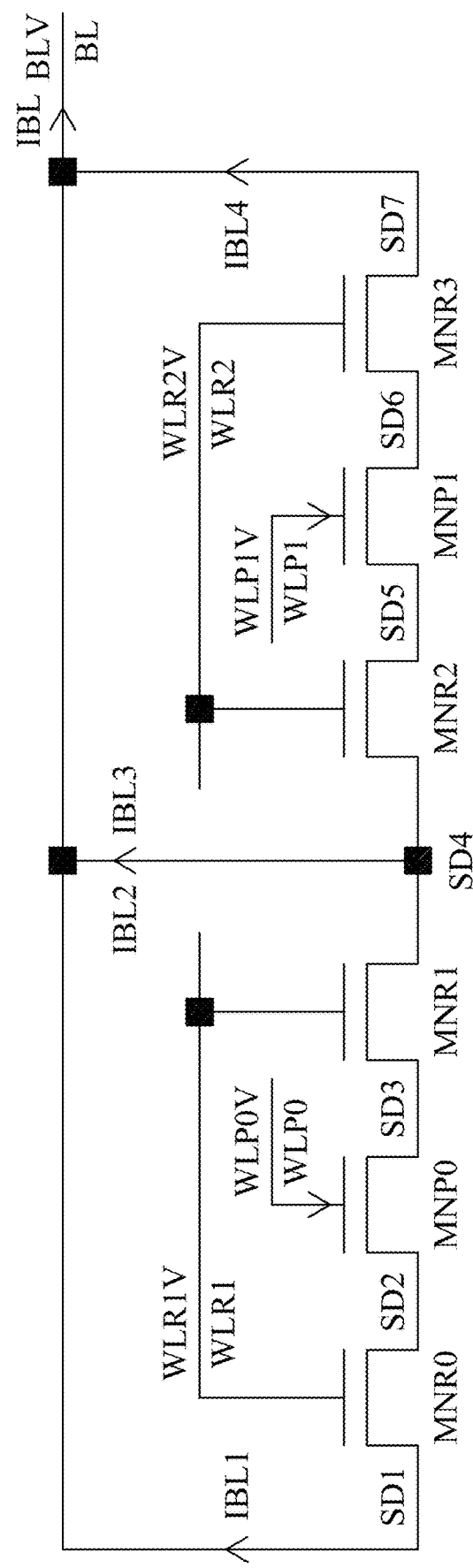

FIG. 2A depicts a cross-sectional view of IC device 200 along plane A-A' including the X and Z directions discussed above with respect to FIGS. 1A-1F, FIG. 2B depicts a plan view of IC device 200-1, an embodiment of IC device 200, and the X and Y directions, FIG. 2C depicts a plan view of IC device 200-2, an embodiment of IC device 200, and the X and Y directions, and FIG. 2D is a schematic representation of IC device 200.

The depictions of IC device 200 in FIGS. 2A-2D are simplified for the purpose of clarity. FIGS. 2A-2C depict views of IC device 200 with various features included and excluded to facilitate the discussion below. In various embodiments, IC device 200 includes one or more metal interconnects, contacts, vias, gate structure or other transistor elements, wells, isolation structures, or the like, in addition to the elements depicted in FIGS. 2A-2C.

IC device 200 includes anti-fuse device MNP0 and transistors MNR0 and MNR1 including S/D structures SD1-SD4 and portions of active area AA, contact structures C1 and C2, via structures V1-V3, conductive element WLRM0, and conductive paths WLR1 and WLP0, each discussed above with respect to FIGS. 1A-1F. IC device 200 also includes an anti-fuse device MNP1 and transistors MNR2 and MNR3 including S/D structures SD4-SD7 and portions of active area AA, a contact structure C3, via structures V4-V6, a conductive element WLRM1, and conductive paths WLR2 and WLP1.

Anti-fuse device MNP1, transistors MNR2 and MNR3, S/D structures SD4-SD7, contact structure C3, via structures V4-V6, conductive element WLRM1, and conductive paths WLR2 and WLP1 have configurations that correspond to those of anti-fuse device MNP0, transistors MNR0 and MNR1, S/D structures SD1-SD4, contact structures C1 and C2, via structures V1-V3, conductive element WLRM0, and conductive paths WLR1 and WLP0, respectively, as discussed above with respect to FIGS. 1A-1F; thus, detailed descriptions thereof are omitted.

FIGS. 2A-2D depict currents IBL1 and IBL2, and FIGS. 2A and 2D depict current IBL, each discussed above with respect to FIGS. 1A-1F. FIGS. 2A-2D also depict currents IBL3 and IBL4 discussed below.

As depicted in FIGS. 2A-2D, each of transistors MNR1 and MNR2 includes a portion of S/D structure SD4, transistors MNR1 and MNR2 thereby sharing S/D structure SD4. Similarly, anti-fuse device MNP1 shares S/D structure SD5 with transistor MNR2 and shares S/D structure SD6 with transistor MNR3. In some embodiments, transistor MNR3 shares S/D structure SD7 with at least one other IC device (not shown).

Via structure V5 overlies and electrically connects a gate structure (not labeled) of anti-fuse device MNP1 to conductive path WLP1. Via structure V5 is depicted in FIGS. 2B and 2C, and is included in the schematic representation of conductive path WLP1 depicted in FIGS. 2A and 2D.

Conductive path WLP1, also referred to as a conductive or bias voltage line in some embodiments, is configured as at least part of a low-resistance electrical connection between via structure V5 and a fourth voltage source (not shown) external to IC device 200 and configured to provide a voltage WLP1V, also referred to as a signal in some embodiments. The gate structure of anti-fuse device MNP1 is thereby electrically connected to conductive path WLP1 through via structure V5, and anti-fuse device MNP1 is thereby configured to receive voltage WLP1V from the fourth voltage source in operation.

Via structure V4 overlies and electrically connects a gate structure (not labeled) of transistor MNR2 to conductive element WLRM1, and via structure V6 overlies and electrically connects a gate structure (not labeled) of transistor MNR3 to conductive element WLRM1. Conductive element WLRM1 is part of conductive path WLR2. Via structures V4 and V6 and conductive element WLRM1 are depicted in FIGS. 2B and 2C, and are included in the schematic representation of conductive path WLR2 depicted in FIGS. 2A and 2D.

In the embodiment depicted in FIGS. 2B and 2C, via structures V4 and V6 are configured to electrically connect the gate structures of transistors MNR2 and MNR3 to conductive path WLR2 through the single conductive element WLRM1, and thereby couple the gate structures of transistors MNR2 and MNR3 to each other. In some embodiments, via structures V4 and V6 are configured to electrically connect respective gate structures of transistors MNR2 and MNR3 to conductive path WLR2, and thereby couple the gate structures of transistors MNR2 and MNR3 to each other through one or more conductive elements in addition to or instead of conductive element WLRM1.

Conductive path WLR2, also referred to as a selection signal line in some embodiments, is configured to electrically connect the gate structures of transistors MNR2 and MNR3 to a fifth voltage source (not shown) external to IC device 200 and configured to provide a voltage WLR2V. The gate structures of transistors MNR2 and MNR3 are thereby electrically connected to conductive path WLR2 through respective via structures V4 and V6, and each of transistors MNR2 and MNR3 is thereby configured to receive voltage WLR2V from the fifth voltage source in operation.

Contact structure C3 overlies S/D structure SD7 and is configured to electrically connect S/D structure SD7 to conductive path BL. S/D structure SD7 of transistor MNR3 is thereby configured to receive voltage BLV from the third voltage source in operation.

In some embodiments, contact structures C1, C2, and C3 are electrically connected to a same conductive element of conductive path BL, and S/D structures SD1, SD4, and SD7 are thereby configured to receive voltage BLV from conductive path BL through respective contact structures C1, C2, and C3. In various embodiments, one or more of contact structures C1, C2, and C3 are electrically connected to separate conductive elements of conductive path BL, and S/D structures SD1, SD4, and SD7 are otherwise configured to receive voltage BLV from conductive path BL through respective contact structures C1, C2, and C3.

FIG. 2B depicts IC device 200-1, an embodiment of IC device 200 in which via structures V1, V3, V4, and V6 and conductive elements WLRM0 and WLRM1 are positioned at locations away from active area AA in the positive Y direction, and via structures V2 and V5 are positioned at locations away from active area AA in the negative Y direction. In some embodiments, via structures V1, V3, V4, and V6 and conductive elements WLRM0 and WLRM1 are positioned at locations away from active area AA in the negative Y direction, and via structures V2 and V5 are positioned at locations away from active area AA in the positive Y direction.

In the embodiment depicted in FIG. 2B, via structures V1, V3, V4, and V6 and conductive elements WLRM0 and WLRM1 are aligned with each other in the X direction and via structures V2 and V5 are aligned with each other in the X direction. In various embodiments, one or more of via structures V1, V3, V4, and/or V6 and/or conductive elements WLRM0 and/or WLRM1 is not aligned with another one or more of via structures V1, V3, V4, and/or V6 and/or conductive elements WLRM0 and/or WLRM1 in the X direction and/or via structures V2 and V5 are not aligned with each other in the X direction.

FIG. 2C depicts IC device 200-2, an embodiment of IC device 200 in which via structures V1, V3, and V5 and conductive element WLRM0 are positioned at locations away from active area AA in the positive Y direction, and via structures V2, V4, and V6 and conductive element WLRM1 are positioned at locations away from active area AA in the negative Y direction. In some embodiments, via structures V1, V3, and V5 and conductive element WLRM0 are positioned at locations away from active area AA in the negative Y direction, and via structures V2, V4, and V6 and conductive element WLRM1 are positioned at locations away from active area AA in the positive Y direction.

In the embodiment depicted in FIG. 2C, via structures V1, V3, and V5 and conductive element WLRM0 are aligned with each other in the X direction and via structures V2, V4, and V6 and conductive element WLRM1 are aligned with each other in the X direction. In various embodiments, one or more of via structures V1, V3, and/or V5 and/or conductive element WLRM0 is not aligned with another one or more of via structures V1, V3, and/or V5 and/or conductive element WLRM0 in the X direction and/or one or more of via structures V2, V4, and/or V6 and/or conductive element WLRM1 is not aligned with another one or more of via structures V2, V4, and/or V6 and/or conductive element WLRM1 in the X direction.

In operation, transistors MNR2 and MNR3 are configured as discussed above to be simultaneously switched on or off responsive to voltage WLR2V received at their respective gate structures, and to voltage BLV received at respective S/D structures SD4 and SD7, in the manner discussed above with respect to transistors MNR0 and MNR1. When transistors MNR2 and MNR3 are switched on, voltage WLP1V at the gate structure of anti-fuse device MNP1 causes anti-fuse device MNP1 to be biased in the manner discussed above with respect to anti-fuse device MNP0, and causes currents IBL3 and IBL4 to flow as depicted in FIGS. 2A-2D and in the manner discussed above with respect to respective currents IBL1 and IBL2.

Accordingly, in operation, current IBL3 flows from anti-fuse device MNP1 to S/D structure SD4 in the negative X direction, current IBL4 flows from anti-fuse device MNP1 to S/D structure SD7 in the positive X direction, and a sum of currents IBL3 and IBL4 is equal to current IBL in conductive path BL.

IC device 200 is configured so that only one of anti-fuse devices MNP0 or MNP1 is biased at a time, current IBL thereby alternatively including the pair of currents IBL1 and IBL2 or the pair of currents IBL3 and IBL4. In various embodiments, IC device 200 includes one or more anti-fuse devices (not shown) in addition to anti-fuse devices MNP0 and MNP1, and is configured so that current IBL alternatively includes one more pairs of currents (not shown) in addition to pairs of currents IBL1 and IBL2 and currents IBL3 and IBL4.

In the embodiment depicted in FIGS. 2A-2D, IC device 200 includes a single active area AA, conductive path WLP0 is electrically connected to a single anti-fuse device MNP0, conductive path WLP1 is electrically connected to a single anti-fuse device MNP1, conductive path WLR1 is electrically connected to a single pair of transistors MNR0 and MNR1, and conductive path WLR2 is electrically connected to a single pair of transistors MNR2 and MNR3. In various embodiments, IC device 200 includes one or more additional active areas (not shown) including one or more additional pairs of anti-fuse devices (not shown) such that one or more of conductive path WLP0 is electrically connected to a plurality of anti-fuse devices including anti-fuse device MNP0, conductive path WLP1 is electrically connected to a plurality of anti-fuse devices including anti-fuse device MNP1, conductive path WLR1 is electrically connected to a plurality of pairs of transistors including pair of transistors MNR0 and MNR1, or conductive path WLR2 is electrically connected to a plurality of pairs of transistors including pair of transistors MNR2 and MNR3.

By the configuration discussed above, IC device 200 includes a plurality of anti-fuse devices, e.g., anti-fuse devices MNP0 and MNP1, each anti-fuse device corresponding to a pair of transistors, e.g., transistors MNR0 and MNR1 and transistors MNR2 and MNR3, configured as discussed above with respect to IC device 100 and FIGS. 1A-1F. IC device 200 is thereby configured to be capable of realizing the benefits discussed above with respect to IC device 100.

Figure 3:
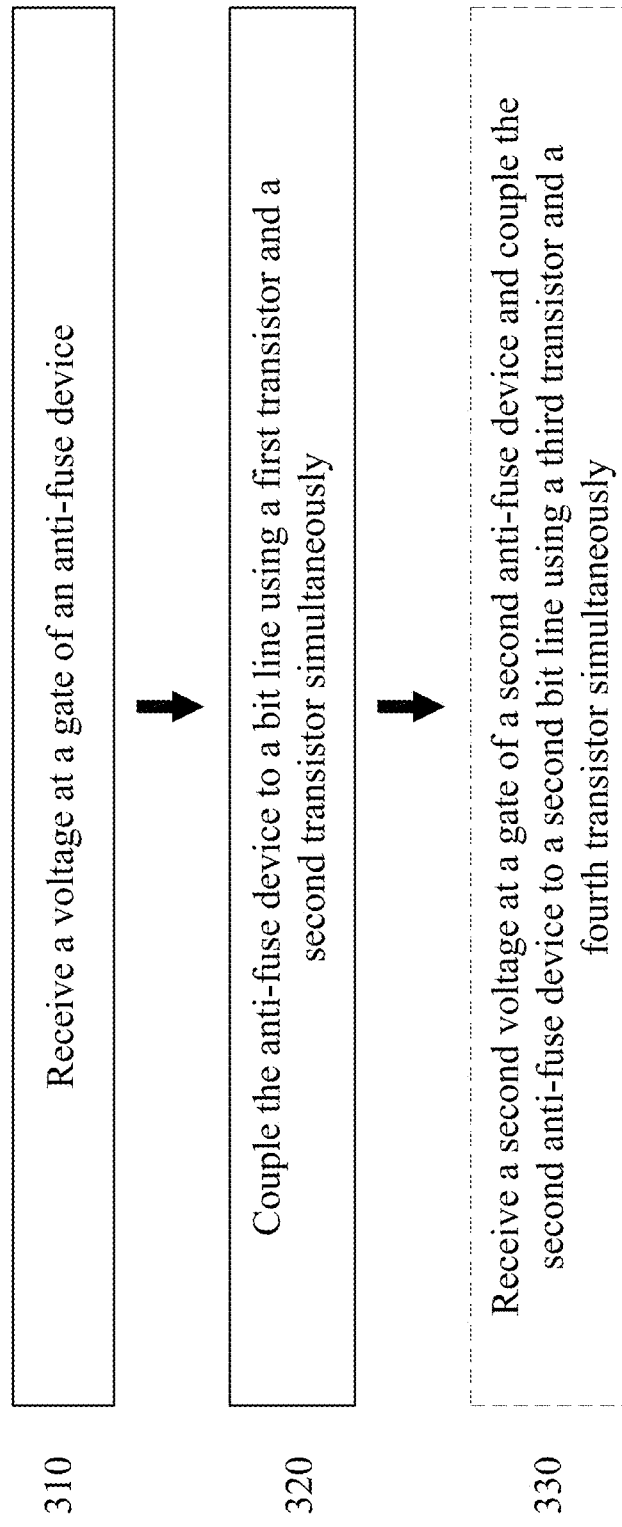
FIG. 3 is a flowchart of a method of operating a circuit, in accordance with some embodiments.

FIG. 3 is a flowchart of a method 300 of operating a circuit, in accordance with some embodiments. Method 300 is usable with a circuit including an anti-fuse device, e.g., IC device 100 discussed above with respect to FIGS. 1A-1F or IC device 200 discussed above with respect to FIGS. 2A-2D.

In some embodiments, operating a circuit using method 300 includes performing a program or read operation on the anti-fuse device. In some embodiments, operating the circuit using method 300 includes breaking down a dielectric layer, e.g., dielectric layer OXP discussed above with respect to IC device 100 and FIGS. 1A-1F.

The sequence in which the operations of method 300 are depicted in FIG. 3 is for illustration only; the operations of method 300 are capable of being executed in sequences that differ from that depicted in FIG. 3. In some embodiments, operations in addition to those depicted in FIG. 3 are performed before, between, during, and/or after the operations depicted in FIG. 3. In some embodiments, the operations of method 300 are a subset of operations of a method of operating a memory array.

At operation 310, a voltage is received at a gate of an anti-fuse device. Receiving the voltage includes receiving the voltage having a voltage value configured to perform a program or read operation on the anti-fuse device.

In some embodiments, the anti-fuse device is one anti-fuse device of a plurality of anti-fuse devices, and receiving the voltage includes selecting the anti-fuse device from the plurality of anti-fuse devices. In some embodiments, receiving the voltage includes receiving the voltage at gates of a subset, e.g., a column, of the plurality of anti-fuse devices.

In various embodiments, receiving the voltage includes receiving voltage WLP0V at gate structure GP0 of anti-fuse device MNP0, discussed above with respect to FIGS. 1A-2D, or the gate structure of anti-fuse device MNP1, discussed above with respect to FIGS. 2A-2D.

In some embodiments, receiving the voltage includes receiving the voltage through a via structure. In some embodiments, receiving the voltage through the via structure includes receiving the voltage through via structure V2 or V5, discussed above with respect to FIGS. 1A-2D.

At operation 320, the anti-fuse device is coupled to a bit line using a first transistor and a second transistor simultaneously. Coupling the anti-fuse device to the bit line includes simultaneously switching on the first and second transistors, thereby providing parallel current paths between the anti-fuse device and the bit line.

In some embodiments, coupling the anti-fuse device to the bit line includes coupling anti-fuse device MNP0 to conductive path BL using transistors MNR0 and MNR1, discussed above with respect to FIGS. 1A-2D, or coupling anti-fuse device MNP1 to conductive path BL using transistors MNR2 and MNR3, discussed above with respect to FIGS. 2A-2D.

In some embodiments, using the first transistor and the second transistor simultaneously includes receiving a same signal at a gate of the first transistor and a gate of the second transistor. In some embodiments, receiving the same signal includes the first transistor receiving the signal through a first via and the second transistor receiving the signal through a second via. In some embodiments, receiving the signal through the first via includes receiving the signal from a conductive element, e.g., a metal segment, and receiving the signal through the second via includes receiving the signal from the same conductive element. In various embodiments, receiving the signal from the conductive element includes receiving the signal from conductive element WLRM0 or WLRM1, discussed above with respect to FIGS. 1B, 2B, and 2C.

In some embodiments, the first and second transistors are one transistor pair of a plurality of transistor pairs, and receiving the same signal includes selecting the first and second transistors from the plurality of transistor pairs. In some embodiments, receiving the same signal includes receiving one signal of a plurality of signals corresponding to a subset, e.g., a row or word, of a plurality of anti-fuse devices corresponding to the plurality of transistor pairs. In some embodiments, receiving the same signal includes receiving one of voltages WLR1V or WLR2V, discussed above with respect to FIGS. 1A-2D.

In some embodiments, coupling the anti-fuse device to the bit line includes the anti-fuse device receiving a voltage from the bit line. In some embodiments, receiving the voltage from the bit line includes transferring the voltage from a first S/D structure of the first transistor to an S/D structure shared by the first transistor and the anti-fuse device, and transferring the voltage from a first S/D structure of the second transistor to an S/D structure shared by the second transistor and the anti-fuse device. In some embodiments, receiving the voltage from the bit line includes receiving voltage BLV from conductive path BL, discussed above with respect to FIGS. 1A-2D.

In some embodiments, coupling the anti-fuse device to the bit line includes causing the anti-fuse device to change from an un-programmed state to a programmed state. In some embodiments, coupling the anti-fuse device to the bit line includes applying an electric field to a dielectric layer of the anti-fuse device, the electric field having a symmetry based on the first transistor and the second transistor. In some embodiments, coupling the anti-fuse device to the bit line includes programming the anti-fuse device by breaking down the dielectric layer between the gate and a portion of a substrate between the first transistor and the second transistor. In some embodiments, coupling the anti-fuse device to the bit line includes applying an electric field to dielectric layer OXP, discussed above with respect to FIGS. 1A-2D.

In some embodiments, coupling the anti-fuse device to the bit line includes generating a current in the bit line, the current including a first component flowing through the first transistor in a first direction and a second component flowing through the second transistor in a second direction opposite the first direction. In some embodiments, the first component flows through a first contact structure, the second component flows through a second contact structure, and the anti-fuse device and first and second transistors are positioned between the first and second contact structures. In some embodiments, the first and second components flow through contact structures C1 and C2 or through contact structures C2 and C3, discussed above with respect to FIGS. 1A-2D.

In some embodiments, generating the current in the bit line includes generating the current at a location of a dielectric breakdown in the dielectric layer of the anti-fuse device. In some embodiments, generating the current in the bit line includes generating the current through parallel substrate current paths based on the location of the dielectric breakdown. The parallel substrate current paths have an equivalent substrate resistance value based on the location of the dielectric breakdown, and generating the current is based on a maximum equivalent substrate resistance value corresponding to the dielectric breakdown location at a midpoint between the first and second transistors. In some embodiments, generating the current in the bit line includes generating the current based on resistors Rb0 and Rb1, discussed above with respect to FIGS. 1E and 1F.

In some embodiments, the anti-fuse device is one anti-fuse device of a plurality of anti-fuse devices, e.g., an anti-fuse array, and generating the current in the bit line includes generating the current as part of a read operation on the plurality of anti-fuse devices.

At operation 330, in some embodiments, a second voltage is received at a gate of a second anti-fuse device, and the second anti-fuse device is coupled to a second bit line using a third transistor and a fourth transistor simultaneously. The anti-fuse device and the second anti-fuse device are included in a plurality of anti-fuse devices, and receiving the second voltage includes selecting the second anti-fuse device from the plurality of anti-fuse devices. In various embodiments, selecting the second anti-fuse device includes selecting the second anti-fuse device separately from selecting the anti-fuse device or selecting the anti-fuse device and the second anti-fuse device simultaneously.

In various embodiments, receiving the second voltage at the gate of the second anti-fuse device includes receiving the second voltage at the second anti-fuse device in a same active area as the anti-fuse device or in an active area different from an active area of the anti-fuse device.

In various embodiments, coupling the second anti-fuse device to the second bit line includes coupling the anti-fuse and second anti-fuse devices to a same bit line or to different bit lines.

In some embodiments, receiving the second voltage includes receiving voltage WLP1V at the gate of anti-fuse device MNP1, and using the third and fourth transistors includes using transistors MNR2 and MNR3, discussed above with respect to FIGS. 2A-2D.

In some embodiments, coupling the second anti-fuse device to the second bit line includes generating a second current in the second bit line, the second current including a first component flowing through the third transistor in the second direction and a second component flowing through the fourth transistor in the first direction. In some embodiments, the first component of the second current flows through a contact structure shared between the third transistor and the second transistor of the anti-fuse device.

In some embodiments, the first component of the second current flows through contact structure C2 shared between the transistor MNR2 and transistor MNR1 of anti-fuse device MNP0, discussed above with respect to FIGS. 2A-2D.

By executing some or all of the operations of method 300, an operation, e.g., a program or read operation, is performed on a circuit in which an anti-fuse device receives a voltage and is coupled to a bit line using first and second transistors simultaneously, thereby achieving the benefits discussed above with respect to IC device 100.

FIG. 4 is a flowchart of a method 400 of manufacturing an anti-fuse device, in accordance with some embodiments. Method 400 is operable to form any of IC devices 100 or 200, discussed above with respect to FIGS. 1A-2D.

The sequence in which the operations of method 400 are depicted in FIG. 4 is for illustration only; the operations of method 400 are capable of being executed simultaneously and/or in sequences that differ from that depicted in FIG. 4. In some embodiments, operations in addition to those depicted in FIG. 4 are performed before, between, during, and/or after the operations depicted in FIG. 4.

In some embodiments, one or more operations of method 400 are a subset of operations of a method of forming a memory array. In some embodiments, one or more operations of method 400 are a subset of operations of an IC manufacturing flow, e.g., an IC manufacturing flow discussed below with respect to a manufacturing system 800 and FIG. 8.

At operation 410, an anti-fuse device is formed on a substrate, e.g., substrate 100B discussed above with respect to FIGS. 1A-2D. Forming the anti-fuse device includes forming a first gate structure, a first S/D structure in an active area, and a second S/D structure in the active area, the first gate structure partially overlying each of the first and second S/D structures.

Forming the first and second S/D structures includes performing one or more manufacturing operations in accordance with forming S/D structures SD2 and SD3 and active area AA, discussed above with respect to FIGS. 1A-2D. Forming the first gate structure includes performing one or more manufacturing operations in accordance with forming gate structure GP0, and forming the anti-fuse device thereby includes performing one or more manufacturing operations in accordance with forming anti-fuse device MNP0, discussed above with respect to FIGS. 1A-2D.

In some embodiments, forming the anti-fuse device includes constructing an electrical connection between the first gate structure and a conductive path configured to carry a first voltage. Constructing the electrical connection includes performing one or more manufacturing operations in accordance with constructing via structure V2 and, in some embodiments, some or all of conductive path WLP0, discussed above with respect to FIGS. 1A-2D.

In some embodiments, forming the anti-fuse device includes forming one anti-fuse device as part of forming a plurality of anti-fuse devices, e.g., an anti-fuse device array.

At operation 420, a first transistor including the first S/D structure and a second transistor including the second S/D structure are formed. Forming the first and second transistors includes forming the first transistor at a position away from the anti-fuse device in a first direction, and forming the second transistor at a position away from the anti-fuse device in a second direction opposite the first direction, the anti-fuse device thereby being formed between the first and second transistors.

Forming the first transistor includes forming a second gate structure and a third S/D structure in the active area, the second gate structure partially overlying each of the first and third S/D structures. Forming the second transistor includes forming a third gate structure and a fourth S/D structure in the active area, the third gate structure partially overlying each of the second and fourth S/D structures.

Forming the third and fourth S/D structures includes performing one or more manufacturing operations in accordance with forming S/D structures SD1 and SD4, discussed above with respect to FIGS. 1A-2D. Forming the second and third gate structures includes performing one or more manufacturing operations in accordance with forming respective gate structures GR0 and GR1, and forming the first and second transistors thereby includes performing one or more manufacturing operations in accordance with forming respective transistors MNR0 and MNR1, discussed above with respect to FIGS. 1A-2D.

In some embodiments, forming the first and second transistors includes forming one transistor pair as part of forming a plurality of transistor pairs of a corresponding plurality of anti-fuse devices, e.g., an anti-fuse device array.

At operation 430, an electrical connection between gates of the first and second transistors is constructed. Constructing the electrical connection includes constructing an electrical connection between each of the second and third gate structures and a conductive path configured to carry a second voltage. Constructing the electrical connection includes performing one or more manufacturing operations in accordance with forming via structures V1 and V3, discussed above with respect to FIGS. 1A-2D.

In some embodiments, constructing the electrical connection includes constructing a conductive segment in a metal zero layer of the manufacturing process. In some embodiments, constructing the electrical connection includes performing one or more manufacturing operations in accordance with forming conductive element WLRM0, discussed above with respect to FIGS. 1A-2D.

In some embodiments, constructing the electrical connection includes constructing the electrical connection between gates of one transistor pair as part of constructing electrical connections between gates of a plurality of transistor pairs of a corresponding plurality of anti-fuse devices, e.g., an anti-fuse device array.

At operation 440, an electrical connection between the third S/D structure of the first transistor and the fourth S/D structure of the second transistor is constructed. Constructing the electrical connection includes constructing an electrical connection between each of the third and fourth S/D structures and a conductive path configured to carry a third voltage. Constructing the electrical connection includes performing one or more manufacturing operations in accordance with forming contact structures C1 and C2, discussed above with respect to FIGS. 1A-2D.

In some embodiments, constructing the electrical connection includes constructing a conductive segment in a metal zero layer of the manufacturing process. In some embodiments, constructing the electrical connection includes performing one or more manufacturing operations in accordance with forming conductive path BL, discussed above with respect to FIGS. 1A-2D.

In some embodiments, constructing the electrical connection includes constructing the electrical connection between S/D structures of one transistor pair as part of constructing electrical connections between S/D structures of a plurality of transistor pairs of a corresponding plurality of anti-fuse devices, e.g., an anti-fuse device array.

The operations of method 400 are usable to form an IC device that includes at least one anti-fuse device positioned between a pair of electrically connected transistors and is thereby configured to have the properties, and thus the benefits, discussed above with respect to IC devices 100 and 200.

Figure 5:
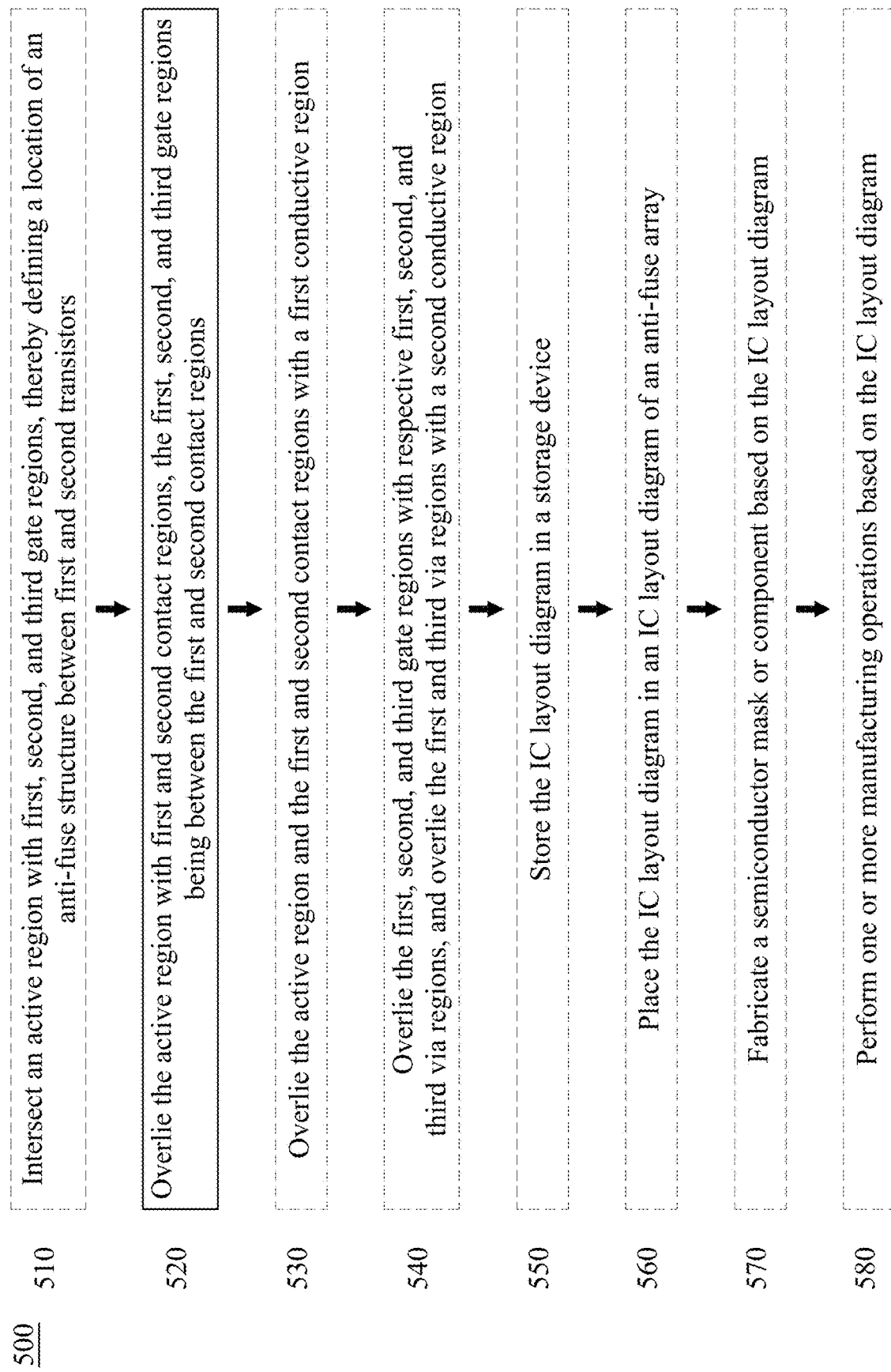
FIG. 5 is a flowchart of a method of generating an IC layout diagram, in accordance with some embodiments.

FIG. 5 is a flowchart of a method 500 of generating an IC layout diagram, in accordance with some embodiments. In some embodiments, generating the IC layout diagram includes generating an IC layout diagram, e.g., IC layout diagram 600A or 600B discussed below, of an IC device, e.g., IC device 100 or 200 discussed above with respect to FIGS. 1A-2D, manufactured based on the generated IC layout diagram. Non-limiting examples of IC devices include memory circuits, logic devices, processing devices, signal processing circuits, and the like.

In some embodiments, some or all of method 500 is executed by a processor of a computer. In some embodiments, some or all of method 500 is executed by a processor 702 of EDA system 700, discussed below with respect to FIG. 7.

Some or all of the operations of method 500 are capable of being performed as part of a design procedure performed in a design house, e.g., design house 820 discussed below with respect to FIG. 8.

In some embodiments, the operations of method 500 are performed in the order depicted in FIG. 5. In some embodiments, the operations of method 500 are performed simultaneously and/or in an order other than the order depicted in FIG. 5. In some embodiments, one or more operations are performed before, between, during, and/or after performing one or more operations of method 500.

Figure 6A:
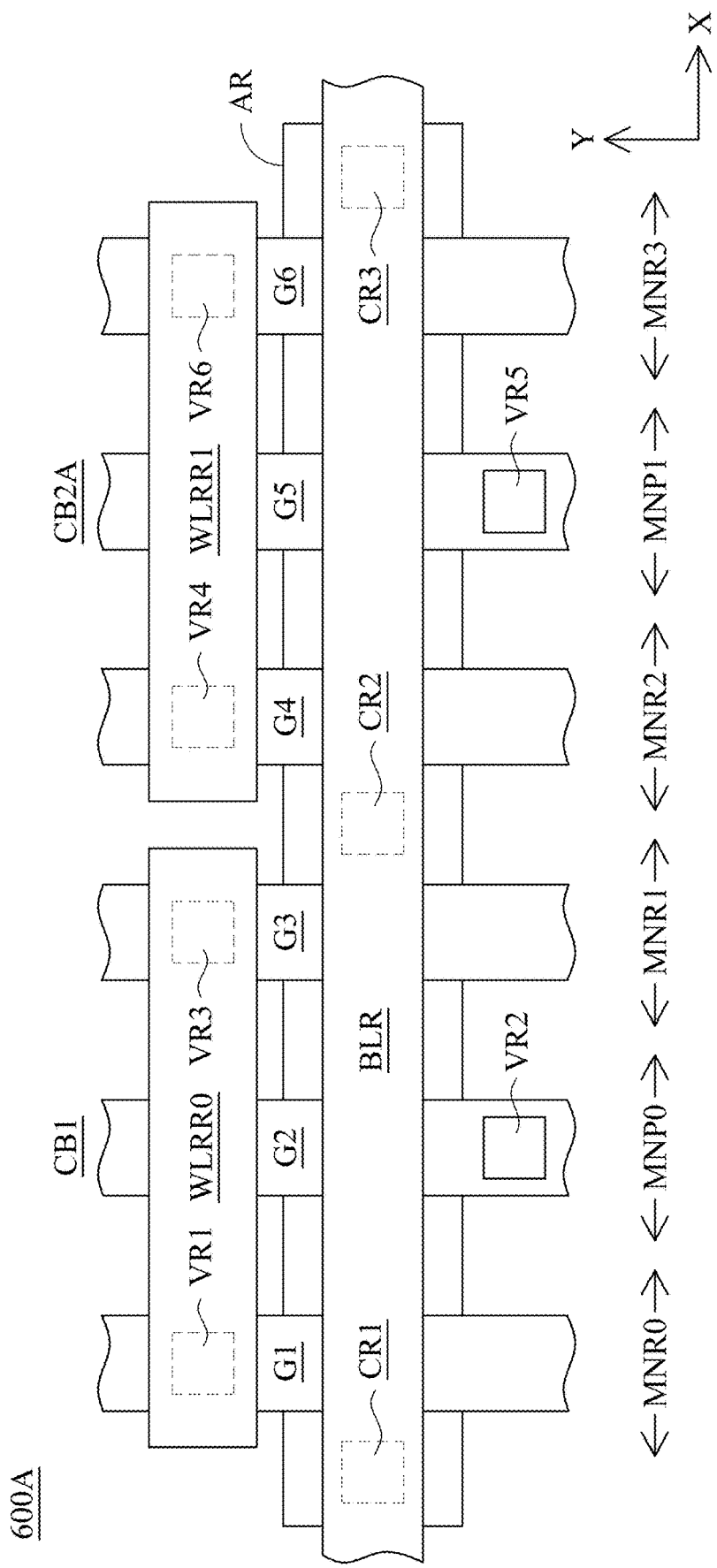
FIGS. 6A and 6B depict anti-fuse cell layout diagrams, in accordance with some embodiments.
Figure 6B:
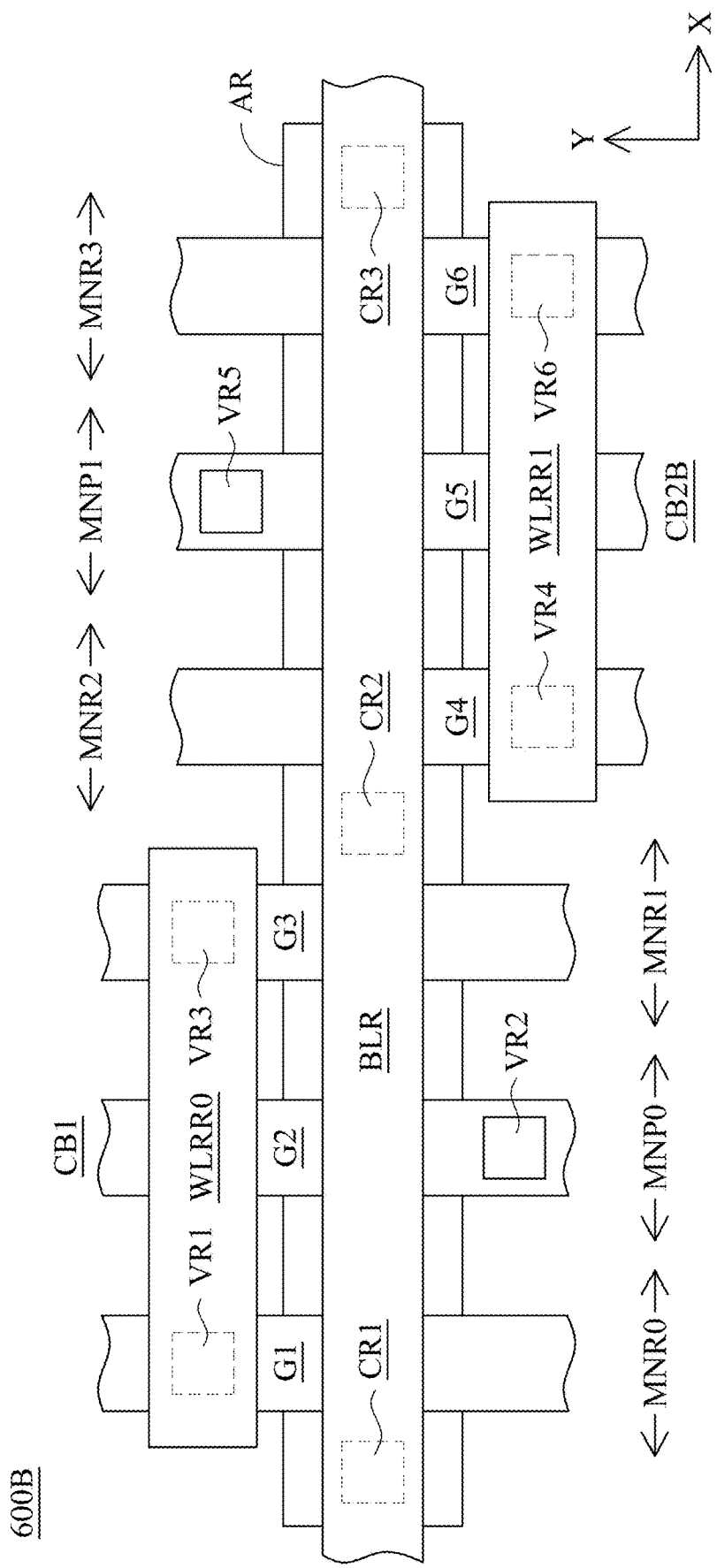

FIGS. 6A and 6B are depictions of non-limiting examples of respective IC layout diagrams 600A and 600B generated by executing one or more operations of method 500, in some embodiments. In addition to IC layout diagram 600A or 600B, each of FIGS. 6A and 6B includes the X and Y directions, discussed above with respect to FIGS. 1B, 2B, and 2C.

IC layout diagrams 600A and 600B are simplified for the purpose of clarity. In various embodiments, one or more of IC layout diagrams 600A and 600B includes features in addition to those depicted in FIGS. 6A and 6B, e.g., one or more transistor elements, power rails, isolation structures, wells, conductive elements, or the like.

Each of IC layout diagrams 600A and 600B corresponds to an anti-fuse cell and includes a first cell bit CB1 including layout components corresponding to anti-fuse device MNP0 and transistors MNR0 and MNR1, discussed above with respect to FIGS. 1A-2D, and a bit line region BLR discussed below. In some embodiments, one or both of IC layout diagrams 600A or 600B does not include bit line region BLR.

In the embodiments depicted in FIGS. 6A and 6B, IC layout diagram 600A includes a second cell bit CB2A, and IC layout diagram 600B includes a second cell bit CB2B. Each of cell bits CB2A and CB2B includes layout components corresponding to anti-fuse device MNP1 and transistors MNR2 and MNR3, discussed above with respect to FIGS. 2A-2D. Cell bits CB2A and CB2B differ in the arrangement of the layout components as discussed below. In various embodiments, one or both of IC layout diagrams 600A or 600B does not include corresponding cell bit CB2A or CB2B, and/or includes one or more additional cell bits (not shown) in addition to cell bit CB1 and, if present cell bit CB2A or CB2B.

Cell bit CB1 includes gate regions G1-G3 intersecting an active region AR, via regions VR1-VR3 overlying respective gate regions G1-G3, a conductive region WLRR0 overlying via regions VR1 and VR3 and intersecting gate regions G1-G3, and contact regions CR1 and CR2 overlying active region AR and underlying bit line region BLR. In the embodiment depicted in FIGS. 6A and 6B, via regions VR1 and VR3 and conductive region WLRR0 are positioned at locations away from active region AR in the positive Y direction, and via region VR2 is positioned at a location away from active region AR in the negative Y direction. In some embodiments, via regions VR1 and VR3 and conductive region WLRR0 are positioned at locations away from active region AR in the negative Y direction, and via region VR2 is positioned at a location away from active region AR in the positive Y direction.

Each of cell bits CB2A and CB2B includes gate regions G4-G6 intersecting active region AR, via regions VR4-VR6 overlying respective gate regions G4-G6, a conductive region WLRR1 overlying via regions VR4 and VR6 and intersecting gate regions G4-G6, and contact regions CR2 and CR3 overlying active region AR and underlying bit line region BLR. Cell bit CB2A includes via regions VR4 and VR6 and conductive region WLRR1 aligned with via regions VR1 and VR3 and conductive region WLRR0 of cell bit CB1 in the X direction, and via region VR5 aligned with via region VR2 of cell bit CB1 in the X direction. Cell bit CB2B includes via region VR5 aligned with via regions VR1 and VR3 and conductive region WLRR0 of cell bit CB1 in the X direction, and via regions VR4 and VR6 and conductive region WLRR1 aligned with via region VR2 of cell bit CB1 in the X direction.

By the configurations depicted in FIGS. 6A and 6B and discussed above, active region AR and contact region CR2 are included in each of cell bits CB1, CB2A, and CB2B. In some embodiments, bit line region BLR is included in each of cell bits CB1, CB2A, and CB2B.

An active region, e.g., active region AR, is a region in the IC layout diagram included in a manufacturing process as part of defining an active area, also referred to as an oxide diffusion or definition (OD), in a semiconductor substrate in which one or more IC device features, e.g., a source/drain region, is formed. In various embodiments, an active area is an n-type or p-type active area of a planar transistor or a fin, field-effect transistor (FinFET). In some embodiments, active region AR is included in a manufacturing process as part of defining active area AA discussed above with respect to FIGS. 1A-2D.

A gate region, e.g., a gate region G1-G6, is a region in the IC layout diagram included in the manufacturing process as part of defining a gate structure in the IC device including at least one of a conductive material or a dielectric material. In various embodiments, one or more gate structures corresponding to a gate region includes at least one conductive material overlying at least one dielectric material. In some embodiments, gate regions G1-G3 are included in a manufacturing process as part of defining respective gate structures GR0, GP0, and GR1 discussed above with respect to FIGS. 1A-2D, and gate regions G4-G6 are included in a manufacturing process as part of defining gate structures of transistor MNR2, anti-fuse device MNP1, and transistor MNR3, respectively, discussed above with respect to FIGS. 2A-2D.

A conductive region, e.g., conductive region WLRR0 or WLRR1 or bit line region BLR, is a region in the IC layout diagram included in the manufacturing process as part of defining one or more segments of one or more conductive layers in the IC device. In various embodiments, one or more conductive regions, e.g., one or more of conductive regions WLRR0 or WLRR1 or bit line region BLR, corresponds to one or more segments of a same or different conductive layers in the IC device. In various embodiments, a conductive region corresponds to one or more of a metal zero, a metal one, or a higher metal layer in the IC device. In some embodiments, conductive regions WLRR0 or WLRR1 or bit line region BLR are included in a manufacturing process as part of defining conductive elements WLRM0 and WLRM1 and conduction path BL, respectively, discussed above with respect to FIGS. 1A-2D.

A via region, e.g., a via region VR1-VR6, is a region in the IC layout diagram included in the manufacturing process as part of defining one or more segments of one or more conductive layers in the IC device configured to form an electrical connection between one or more conductive elements corresponding to a conductive region, e.g., conductive region WLRR0 or WLRR1, and a gate structure corresponding to a gate region, e.g., a respective gate region G1-G6. In various embodiments, the one or more conductive layer segments formed based on a via region includes a via between a corresponding gate structure and a corresponding conductive element in an overlying metal layer, e.g., a metal zero layer, of the IC device. In some embodiments, via regions VR1-VR6 are included in a manufacturing process as part of defining respective via structures V1-V6 discussed above with respect to FIGS. 1A-2D.

A contact region, e.g., a contact region CR1-CR3 is a region in the IC layout diagram included in the manufacturing process as part of defining one or more segments of one or more conductive layers in the IC device configured to form an electrical connection between the one or more conductive elements based on a conductive region, e.g., bit line region BLR, and the active area based on an active region, e.g., active region AR. In various embodiments, the one or more conductive layer segments formed based on a contact region includes a contact between the active area based on the active region and the one or more conductive elements based on the conductive region in an overlying metal layer, e.g., a metal zero layer, of the IC device. In some embodiments, contact regions CR1-CR3 are included in a manufacturing process as part of defining respective contact structures C1-C3 discussed above with respect to FIGS. 1A-2D.

At operation 510, in some embodiments, an active region is intersected with first, second, and third gate regions, thereby defining a location of an anti-fuse structure between locations of first and second transistors. The first gate region corresponds to the first transistor including adjacent portions of the active region, the third gate region corresponds to the second transistor including adjacent portions of the active region, and the second gate region corresponds to the anti-fuse structure including adjacent portions of the active region between the first and second gate regions and between the second and third gate regions.

The first, second, and third gate regions have a spacing corresponding to a gate pitch of a manufacturing process such that the second gate region is offset from each of the first and third gate regions by a distance corresponding to the gate pitch.

Intersecting the active region with the first, second, and third gate regions includes extending each of the first, second, and third gate regions to an area outside the active region along a direction perpendicular to a direction along which the active region extends. In various embodiments, intersecting the active region with the first, second, and third gate regions includes extending one or more of the first, second, or third gate regions to intersect one or more active regions in addition to the active region.

In some embodiments, intersecting the active region with the first, second, and third gate regions is part of intersecting the active region with a plurality of gate regions that includes one or more gate regions in addition to the first, second, and third gate regions. In some embodiments, the one or more additional gate regions include one or more dummy gate regions.

Defining the location of the anti-fuse structure in the active region includes defining a rectangle or other area usable in a manufacturing process for positioning one or more dielectric layers capable of being sustainably altered by a sufficiently strong electric field.

Defining the locations of the first and second transistors in the active region includes defining a rectangle or other area usable in a manufacturing process for positioning one or more dielectric layers capable of controlling a channel in the active area corresponding to the active region. Defining the locations of each of the first and second transistors includes each of the first and second transistors being adjacent to the anti-fuse structure.

In the non-limiting examples depicted in FIGS. 6A and 6B, intersecting the active region with the first, second, and third gate regions includes intersecting active region AR with respective gate regions G1-G3. In some embodiments, intersecting the active region with the first, second, and third gate regions includes intersecting active region AR with respective gate regions G4-G6.

At operation 520, the active region is overlaid with first and second contact regions, the first, second, and third gate regions being between the first and second contact regions. Overlying the active region with the first contact region defines a location of an electrical connection between a portion of the active region included in the first transistor and the first contact region, and overlying the active region with the second contact region defines a location of an electrical connection between the portion of the active region included in the second transistor and the second contact region.

In some embodiments, overlying the active region with the first and second contact regions is part of overlying the active region with a plurality of contact regions that includes one or more contact regions in addition to the first and second contact regions, and overlying the active region with the one or more additional contact regions defines one or more additional locations of one or more electrical connections between portions of the active region included in one or more additional transistors and the one or more additional contact regions.

In the non-limiting examples depicted in FIGS. 6A and 6B, overlying the active region with the first and second contact regions includes overlying active region AR with respective contact regions CR1 and CR2. In some embodiments, overlying the active region with the first and second contact regions includes overlying active region AR with contact region CR3.

At operation 530, in some embodiments, the active region and first and second contact regions are overlaid with a first conductive region. Overlying the active region and first and second contact regions with the first conductive region includes intersecting each of gate regions G1-G3 with the first conductive region.

Overlying the first contact region with the first conductive region defines a location of an electrical connection between the first contact region and the first conductive region, and overlying the second contact region with the first conductive region defines a location of an electrical connection between the second contact region and the first conductive region.

In some embodiments, the first and second contact regions are included in a plurality of contact regions that includes one or more contact regions in addition to the first and second contact regions, and overlying the active region and first and second contact regions includes overlying one or more contact regions in addition to the first and second contact regions. Overlying the one or more additional contact regions defines one or more locations of electrical connections between the one or more additional contact regions and the first conductive region.

In the non-limiting examples depicted in FIGS. 6A and 6B, overlying the active region and the first and second contact regions with the first conductive region includes overlying active region AR and contact regions CR1 and CR2 with bit line region BLR. In some embodiments, overlying the active region and the first and second contact regions with the first conductive region includes overlying contact region CR3 with bit line region BLR.

At operation 540, in some embodiments, the first gate region is overlaid with a first via region, the second gate region is overlaid with a second via region, the third gate region is overlaid with a third via region, and the first and third via regions are overlaid with a second conductive region. In some embodiments, the second via region is overlaid with a third conductive region.

Overlying the first gate region with the first via region defines a location of an electrical connection between the first gate region and the first via region, overlying the second gate region with the second via region defines a location of an electrical connection between the second gate region and the second via region, and overlying the third gate region with the third via region defines a location of an electrical connection between the third gate region and the third via region.

In some embodiments, overlying the first, second, and third gate regions with respective first, second, and third via regions includes overlying the fourth, fifth, and sixth gate regions with respective fourth, fifth, and sixth via regions, thereby defining locations of electrical connections between the fourth, fifth, and sixth gate regions and the respective fourth, fifth, and sixth via regions.

Overlying the first and third via regions with the second conductive region defines locations of electrical connections between the first and second via regions and the second conductive region. In some embodiments, overlying the second via region with the third conductive region defines an electrical connection between the second via region and the third conductive region.

In some embodiments, overlying the first and third via regions with the second conductive region includes overlying the fourth and sixth via regions with a fourth conductive region, thereby defining locations of electrical connections between the fourth and sixth via regions and the fourth conductive region. In some embodiments, overlying the second via region with the third conductive region includes overlying the fifth via region with a fifth conductive region, thereby defining an electrical connection between the fifth via region and the fifth conductive region.

In the non-limiting examples depicted in FIGS. 6A and 6B, overlying the first, second, and third gate regions with the first, second, and third via regions includes overlying gate regions G1-G3 with respective via regions VR1-VR3, and overlying the first and third via regions with the second conductive region includes overlying via regions VR1 and VR3 with conductive region WLRR0. In some embodiments, overlying the second via region with the third conductive region includes overlying via region VR2 with a third conductive region (not shown).

In the non-limiting examples depicted in FIGS. 6A and 6B, in some embodiments, overlying the fourth, fifth, and sixth gate regions with the fourth, fifth, and sixth via regions includes overlying gate regions G4-G6 with respective via regions VR4-VR6, and overlying the fourth and sixth via regions with the fourth conductive region includes overlying via regions VR4 and VR6 with conductive region WLRR1. In some embodiments, overlying the fifth via region with the fifth conductive region includes overlying via region VR5 with a fifth conductive region (not shown).

At operation 550, in some embodiments, the IC layout diagram is stored in a storage device. In various embodiments, storing the IC layout diagram in the storage device includes storing the IC layout diagram in a non-volatile, computer-readable memory or a cell library, e.g., a database, and/or includes storing the IC layout diagram over a network. In some embodiments, storing the IC layout diagram in the storage device includes storing the IC layout diagram over network 714 of EDA system 700, discussed below with respect to FIG. 7.

At operation 560, in some embodiments, the IC layout diagram is placed in an IC layout diagram of an anti-fuse array. In some embodiments, placing the IC layout diagram in the IC layout diagram of the anti-fuse array includes rotating the IC layout diagram about one or more axes or shifting the IC layout diagram relative to one or more additional IC layout diagrams in one or more directions.

At operation 570, in some embodiments, at least one of one or more semiconductor masks, or at least one component in a layer of a semiconductor IC is fabricated based on the IC layout diagram. Fabricating one or more semiconductor masks or at least one component in a layer of a semiconductor IC is discussed below with respect to FIG. 8.

At operation 580, in some embodiments, one or more manufacturing operations are performed based on the IC layout diagram. In some embodiments, performing one or more manufacturing operations includes performing one or more lithographic exposures based on the IC layout diagram. Performing one or more manufacturing operations, e.g., one or more lithographic exposures, based on the IC layout diagram is discussed below with respect to FIG. 8.

By executing some or all of the operations of method 500, an IC layout diagram, e.g., IC layout diagram 600A or 600B, is generated in which an anti-fuse cell includes an anti-fuse device positioned between a pair of electrically connected transistors and is thereby configured to have the properties, and thus the benefits, discussed above with respect to IC devices 100 and 200. Further, compared to approaches in which an anti-fuse cell includes an anti-fuse device positioned between a single selection transistor and a dummy gate region, the IC layout diagram, e.g., IC layout diagram 600A or 600B, generated by executing some or all of the operations of method 500 is capable of achieving the referenced benefits without increasing a size of an anti-fuse cell.

Figure 7:
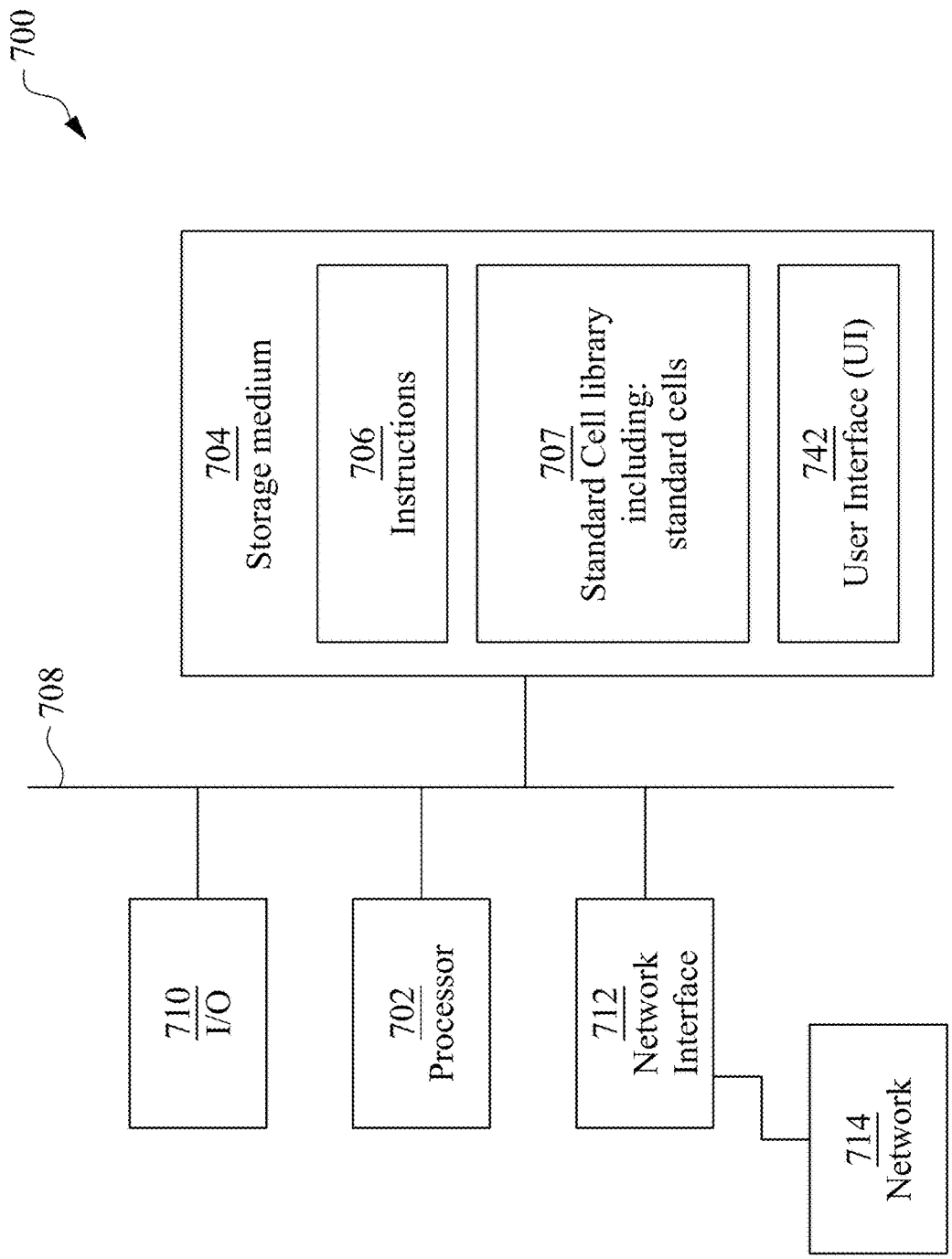
FIG. 7 is a block diagram of an electronic design automation (EDA) system, in accordance with some embodiments.

FIG. 7 is a block diagram of an electronic design automation (EDA) system 700, in accordance with some embodiments.

In some embodiments, EDA system 700 includes an APR system. Methods described herein of designing layout diagrams representing wire routing arrangements, in accordance with one or more embodiments, are implementable, for example, using EDA system 700, in accordance with some embodiments.

In some embodiments, EDA system 700 is a general purpose computing device including a processor 702 and a non-transitory, computer-readable storage medium 704. Computer-readable storage medium 704, amongst other things, is encoded with, i.e., stores, computer program code 706, i.e., a set of executable instructions. Execution of instructions 706 by processor 702 represents (at least in part) an EDA tool which implements a portion or all of, e.g., method 500 described above with respect to FIG. 5 (hereinafter, the noted processes and/or methods).

Processor 702 is electrically coupled to computer-readable storage medium 704 via a bus 708. Processor 702 is also electrically coupled to an I/O interface 710 by bus 708. A network interface 712 is also electrically connected to processor 702 via bus 708. Network interface 712 is connected to a network 714, so that processor 702 and computer-readable storage medium 704 are capable of connecting to external elements via network 714. Processor 702 is configured to execute computer program code 706 encoded in computer-readable storage medium 704 in order to cause system 700 to be usable for performing a portion or all of the noted processes and/or methods. In one or more embodiments, processor 702 is a central processing unit (CPU), a multi-processor, a distributed processing system, an application specific integrated circuit (ASIC), and/or a suitable processing unit.

In one or more embodiments, computer-readable storage medium 704 is an electronic, magnetic, optical, electromagnetic, infrared, and/or a semiconductor system (or apparatus or device). For example, computer-readable storage medium 704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 704 includes a compact disk-read only memory (CD-ROM), a compact disk-read/write (CD-R/W), and/or a digital video disc (DVD).

In one or more embodiments, computer-readable storage medium 704 stores computer program code 706 configured to cause system 700 (where such execution represents (at least in part) the EDA tool) to be usable for performing a portion or all of the noted processes and/or methods. In one or more embodiments, computer-readable storage medium 704 also stores information which facilitates performing a portion or all of the noted processes and/or methods. In one or more embodiments, computer-readable storage medium 704 stores library 707 of standard cells including anti-fuse cell IC layout diagrams as disclosed herein, e.g., IC layout diagrams 600A and/or 600B discussed above with respect to FIGS. 6A and 6B.

EDA system 700 includes I/O interface 710. I/O interface 710 is coupled to external circuitry. In one or more embodiments, I/O interface 710 includes a keyboard, keypad, mouse, trackball, trackpad, touchscreen, and/or cursor direction keys for communicating information and commands to processor 702.

EDA system 700 also includes network interface 712 coupled to processor 702. Network interface 712 allows system 700 to communicate with network 714, to which one or more other computer systems are connected. Network interface 712 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 700.

System 700 is configured to receive information through I/O interface 710. The information received through I/O interface 710 includes one or more of instructions, data, design rules, libraries of standard cells, and/or other parameters for processing by processor 702. The information is transferred to processor 702 via bus 708. EDA system 700 is configured to receive information related to a UI through I/O interface 710. The information is stored in computer-readable medium 704 as user interface (UI) 742.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 700. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 8:
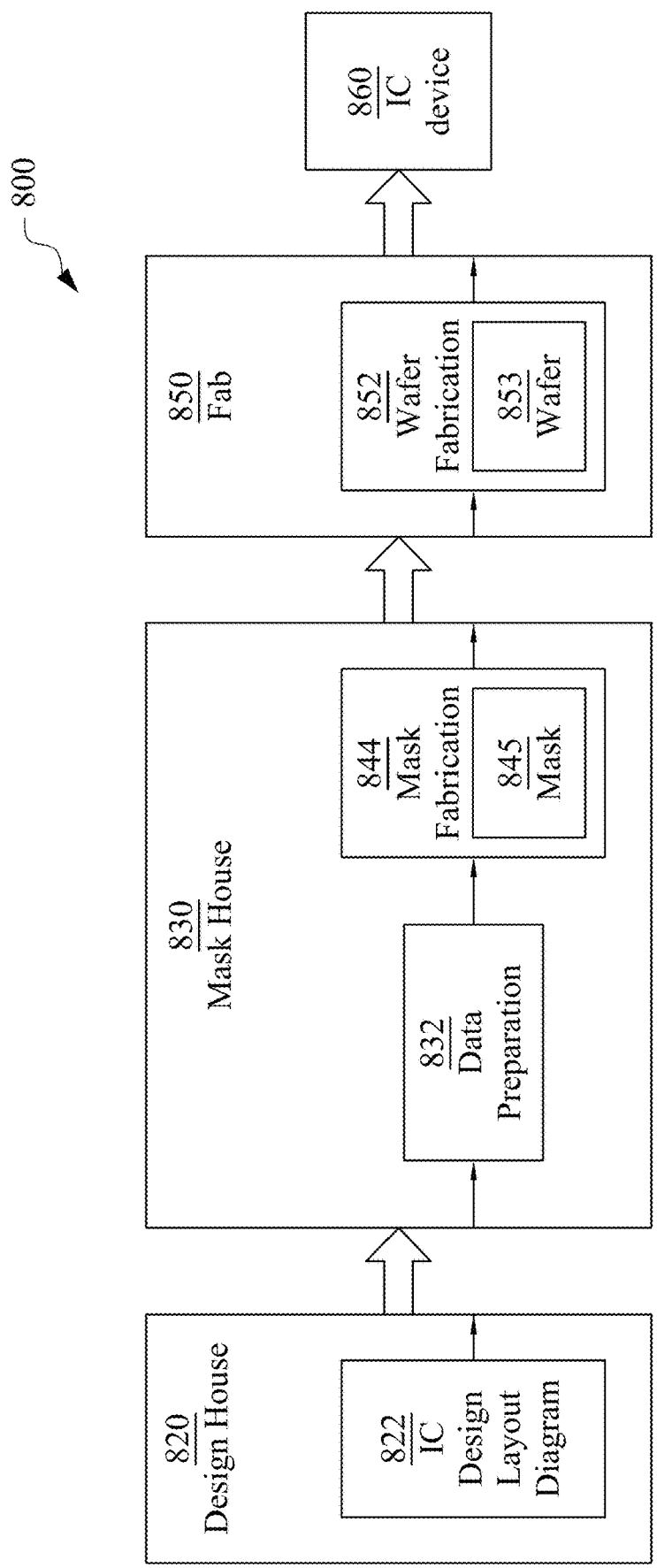
FIG. 8 is a block diagram of an IC manufacturing system, and an IC manufacturing flow associated therewith, in accordance with some embodiments.

FIG. 8 is a block diagram of IC manufacturing system 800, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 800.

In FIG. 8, IC manufacturing system 800 includes entities, such as a design house 820, a mask house 830, and an IC manufacturer/fabricator ("fab") 850, that interact with one another in the design, development, and manufacturing cycles and/or services related to manufacturing an IC device 860. The entities in system 800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 820, mask house 830, and IC fab 850 is owned by a single larger company. In some embodiments, two or more of design house 820, mask house 830, and IC fab 850 coexist in a common facility and use common resources.

Design house (or design team) 820 generates an IC design layout diagram 822. IC design layout diagram 822 includes various geometrical patterns, e.g., an IC layout diagram 600A or 600B discussed above with respect to FIGS. 6A and 6B, designed for an IC device 860, e.g., IC device 100 or 200, discussed above with respect to FIGS. 1A-2D. The geometrical patterns correspond to patterns of metal, oxide, or semiconductor layers that make up the various components of IC device 860 to be fabricated. The various layers combine to form various IC features. For example, a portion of IC design layout diagram 822 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 820 implements a proper design procedure to form IC design layout diagram 822. The design procedure includes one or more of logic design, physical design or place and route. IC design layout diagram 822 is presented in one or more data files having information of the geometrical patterns. For example, IC design layout diagram 822 can be expressed in a GDSII file format or DFII file format.

Mask house 830 includes mask data preparation 832 and mask fabrication 844. Mask house 830 uses IC design layout diagram 822 to manufacture one or more masks 845 to be used for fabricating the various layers of IC device 860 according to IC design layout diagram 822. Mask house 830 performs mask data preparation 832, where IC design layout diagram 822 is translated into a representative data file ("RDF"). Mask data preparation 832 provides the RDF to mask fabrication 844. Mask fabrication 844 includes a mask writer. A mask writer converts the RDF to an image on a substrate, such as a mask (reticle) 845 or a semiconductor wafer 853. The design layout diagram 822 is manipulated by mask data preparation 832 to comply with particular characteristics of the mask writer and/or requirements of IC fab 850. In FIG. 8 mask data preparation 832 and mask fabrication 844 are illustrated as separate elements. In some embodiments, mask data preparation 832 and mask fabrication 844 can be collectively referred to as mask data preparation.

In some embodiments, mask data preparation 832 includes optical proximity correction (OPC) which uses lithography enhancement techniques to compensate for image errors, such as those that can arise from diffraction, interference, other process effects and the like. OPC adjusts IC design layout diagram 822. In some embodiments, mask data preparation 832 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 832 includes a mask rule checker (MRC) that checks the IC design layout diagram 822 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 822 to compensate for limitations during mask fabrication 844, which may undo part of the modifications performed by OPC in order to meet mask creation rules.

In some embodiments, mask data preparation 832 includes lithography process checking (LPC) that simulates processing that will be implemented by IC fab 850 to fabricate IC device 860. LPC simulates this processing based on IC design layout diagram 822 to create a simulated manufactured device, such as IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 822.

It should be understood that the above description of mask data preparation 832 has been simplified for the purposes of clarity. In some embodiments, data preparation 832 includes additional features such as a logic operation (LOP) to modify the IC design layout diagram 822 according to manufacturing rules. Additionally, the processes applied to IC design layout diagram 822 during data preparation 832 may be executed in a variety of different orders.

After mask data preparation 832 and during mask fabrication 844, a mask 845 or a group of masks 845 are fabricated based on the modified IC design layout diagram 822. In some embodiments, mask fabrication 844 includes performing one or more lithographic exposures based on IC design layout diagram 822. In some embodiments, an electron-beam (e-beam) or a mechanism of multiple e-beams is used to form a pattern on a mask (photomask or reticle) 845 based on the modified IC design layout diagram 822. Mask 845 can be formed in various technologies. In some embodiments, mask 845 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 845 includes a transparent substrate (e.g., fused quartz) and an opaque material (e.g., chromium) coated in the opaque regions of the binary mask. In another example, mask 845 is formed using a phase shift technology. In a phase shift mask (PSM) version of mask 845, various features in the pattern formed on the phase shift mask are configured to have proper phase difference to enhance the resolution and imaging quality. In various examples, the phase shift mask can be attenuated PSM or alternating PSM. The mask(s) generated by mask fabrication 844 is used in a variety of processes. For example, such a mask(s) is used in an ion implantation process to form various doped regions in semiconductor wafer 853, in an etching process to form various etching regions in semiconductor wafer 853, and/or in other suitable processes.

IC fab 850 includes wafer fabrication 852. IC fab 850 is an IC fabrication business that includes one or more manufacturing facilities for the fabrication of a variety of different IC products. In some embodiments, IC Fab 850 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 850 uses mask(s) 845 fabricated by mask house 830 to fabricate IC device 860. Thus, IC fab 850 at least indirectly uses IC design layout diagram 822 to fabricate IC device 860. In some embodiments, semiconductor wafer 853 is fabricated by IC fab 850 using mask(s) 845 to form IC device 860. In some embodiments, the IC fabrication includes performing one or more lithographic exposures based at least indirectly on IC design layout diagram 822. Semiconductor wafer 853 includes a silicon substrate or other proper substrate having material layers formed thereon. Semiconductor wafer 853 further includes one or more of various doped regions, dielectric features, multi-level interconnects, and the like (formed at subsequent manufacturing steps).

Details regarding an integrated circuit (IC) manufacturing system (e.g., system 800 of FIG. 8), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, an IC device includes an anti-fuse device including a dielectric layer between a first gate structure and an active area, a first transistor including a second gate structure overlying the active area, and a second transistor including a third gate structure overlying the active area, wherein the first gate structure is between the second gate structure and the third gate structure. In some embodiments, the active area includes first through fourth S/D structures, the second gate structure overlies the first S/D structure and the second S/D structure, the first gate structure overlies the second S/D structure and the third S/D structure, and the third gate structure overlies the third S/D structure and the fourth S/D structure. In some embodiments, the IC device includes a first contact structure configured to electrically connect the active area to a conductor, and a second contact structure configured to electrically connect the active area to the conductor, wherein the first gate structure, the second gate structure, and the third gate structure are between the first contact structure and the second contact structure. In some embodiments, the IC device includes a first via structure configured to electrically connect the second gate structure to a conductor, and a second via structure configured to electrically connect the third gate structure to the conductor. In some embodiments, the IC device is configured to conduct a current from the first gate structure to a bit line through the first and second transistors in parallel. In some embodiments, the anti-fuse device is a first anti-fuse device, the dielectric layer is a first dielectric layer, and the IC device further includes a second anti-fuse device including a second dielectric layer between a fourth gate structure and the active area, a third transistor including a fifth gate structure overlying the active area, and a fourth transistor including a sixth gate structure overlying the active area, wherein the fourth gate structure is between the fifth gate structure and the sixth gate structure. In some embodiments, the active area includes first through seventh S/D structures, the second gate structure overlies the first S/D structure and the second S/D structure, the first gate structure overlies the second S/D structure and the third S/D structure, the third gate structure overlies the third S/D structure and the fourth S/D structure, the fifth gate structure overlies the fourth S/D structure and the fifth S/D structure, the fourth gate structure overlies the fifth S/D structure and the sixth S/D structure, and the sixth gate structure overlies the sixth S/D structure and the seventh S/D structure. In some embodiments, the IC device further includes a first contact structure configured to electrically connect the active area to a conductor, a second contact structure configured to electrically connect the active area to the conductor, and a third contact structure configured to electrically connect the active area to the conductor, wherein the first gate structure, the second gate structure, and the third gate structure are between the first contact structure and the second contact structure, and the fourth gate structure, the fifth gate structure, and the sixth gate structure are between the second contact structure and the third contact structure.

In some embodiments, a circuit includes a conductive line, a bit line, an anti-fuse device, a first transistor, and a second transistor, wherein the anti-fuse device and the first transistor are coupled in series between the conductive line and the bit line, and the anti-fuse device and the second transistor are coupled in series between the conductive line and the bit line. In some embodiments, the first transistor is coupled to a first terminal of the anti-fuse device, and the second transistor is coupled to a second terminal of the anti-fuse device. In some embodiments, each of the first transistor and the second transistor is coupled between the anti-fuse device and the bit line. In some embodiments, a gate of the first transistor is coupled to a gate of the second transistor. In some embodiments, each of the anti-fuse device, the first transistor, and the second transistor includes an NMOS transistor. In some embodiments, the conductive line, the bit line, the anti-fuse device, the first transistor, and the second transistor are included in an anti-fuse cell of an array of anti-fuse cells. In some embodiments, the conductive line is a first conductive line, the anti-fuse device is a first anti-fuse device, and the circuit further includes a second conductive line, a second anti-fuse device, a third transistor, and a fourth transistor, wherein the second anti-fuse device and the third transistor are coupled in series between the second conductive line and the bit line, and the second anti-fuse device and the fourth transistor are coupled in series between the second conductive line and the bit line.

In some embodiments, a method of operating a circuit includes receiving a voltage at a gate of an anti-fuse device, and coupling the anti-fuse device to a bit line using a first transistor and a second transistor simultaneously. In some embodiments, coupling the anti-fuse device to the bit line includes applying an electric field to a dielectric layer of the anti-fuse device, the electric field having a symmetry based on the first transistor and the second transistor. In some embodiments, coupling the anti-fuse device to the bit line includes programming the anti-fuse device by breaking down a dielectric layer between the gate and a portion of a substrate between the first transistor and the second transistor. In some embodiments, coupling the anti-fuse device to the bit line includes generating a current in the bit line, the current including a first component flowing through the first transistor in a first direction and a second component flowing through the second transistor in a second direction opposite the first direction. In some embodiments, using the first transistor and the second transistor simultaneously includes receiving a same signal at a gate of the first transistor and a gate of the second transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) device comprising:
an active area comprising first through fourth source-drain (S/D) structures;
an anti-fuse transistor device comprising a dielectric layer between a first gate structure and the active area;
a first selection transistor comprising a second gate structure overlying the active area; and
a second selection transistor comprising a third gate structure overlying the active area,
wherein
the first gate structure is between the second gate structure and the third gate structure,
the second gate structure overlies the first S/D structure and the second S/D structure,
the first gate structure overlies the second S/D structure and the third S/D structure, and
the third gate structure overlies the third S/D structure and the fourth S/D structure.

2. The IC device of claim 1, further comprising:
a first contact structure configured to electrically connect the active area to a conductor; and
a second contact structure configured to electrically connect the active area to the conductor,
wherein the first gate structure, the second gate structure, and the third gate structure are between the first contact structure and the second contact structure.

3. The IC device of claim 1, further comprising:
a first via structure configured to electrically connect the second gate structure to a conductor; and
a second via structure configured to electrically connect the third gate structure to the conductor.

4. The IC device of claim 1, wherein the IC device is configured to conduct a current from the first gate structure to a bit line through the first and second selection transistors in parallel.

5. The IC device of claim 1, wherein
the anti-fuse transistor device is a first anti-fuse transistor device,
the dielectric layer is a first dielectric layer, and
the IC device further comprises:
a second anti-fuse transistor device comprising a second dielectric layer between a fourth gate structure and the active area;
a third selection transistor comprising a fifth gate structure overlying the active area; and
a fourth selection transistor comprising a sixth gate structure overlying the active area,
wherein the fourth gate structure is between the fifth gate structure and the sixth gate structure.

6. The IC device of claim 5, wherein
the active area further comprises fifth through seventh source drain (S/D) S/D structures,
the fifth gate structure overlies the fourth S/D structure and the fifth S/D structure,
the fourth gate structure overlies the fifth S/D structure and the sixth S/D structure, and
the sixth gate structure overlies the sixth S/D structure and the seventh S/D structure.

7. The IC device of claim 5, further comprising:
a first contact structure configured to electrically connect the active area to a conductor;
a second contact structure configured to electrically connect the active area to the conductor; and
a third contact structure configured to electrically connect the active area to the conductor, wherein
the first gate structure, the second gate structure, and the third gate structure are between the first contact structure and the second contact structure, and
the fourth gate structure, the fifth gate structure, and the sixth gate structure are between the second contact structure and the third contact structure.

8. A circuit comprising:
a conductive line;
a bit line;
an anti-fuse transistor device;
a first selection transistor; and
a second selection transistor,
wherein
the anti-fuse transistor device and the first selection transistor are coupled in series between the conductive line and the bit line, and
the anti-fuse transistor device and the second selection transistor are coupled in series between the conductive line and the bit line.

9. The circuit of claim 8, wherein the first selection transistor is coupled to a first terminal of the anti-fuse transistor device, and the second selection transistor is coupled to a second terminal of the anti-fuse transistor device.

10. The circuit of claim 8, wherein each of the first selection transistor and the second selection transistor is coupled between the anti-fuse transistor device and the bit line.

11. The circuit of claim 8, wherein a gate of the first selection transistor is coupled to a gate of the second selection transistor.

12. The circuit of claim 8, wherein each of the anti-fuse transistor device, the first selection transistor, and the second selection transistor comprises an NMOS transistor.

13. The circuit of claim 8, wherein the conductive line, the bit line, the anti-fuse transistor device, the first selection transistor, and the second selection transistor are included in an anti-fuse cell of an array of anti-fuse cells.

14. The circuit of claim 8, wherein
the conductive line is a first conductive line,
the anti-fuse transistor device is a first anti-fuse transistor device, and
the circuit further comprises:
a second conductive line;
a second anti-fuse transistor device;
a third selection transistor; and
a fourth selection transistor, wherein
the second anti-fuse transistor device and the third selection transistor are coupled in series between the second conductive line and the bit line, and
the second anti-fuse transistor device and the fourth selection transistor are coupled in series between the second conductive line and the bit line.

15. A method of operating a circuit, the method comprising:
receiving a first voltage at a gate of an anti-fuse transistor device overlying a substrate between a first selection transistor and a second selection transistor;
receiving a second voltage at a bit line; and
coupling the anti-fuse transistor device to the bit line, the anti-fuse transistor device thereby receiving the second voltage, by simultaneously switching on the first selection transistor and the second selection transistor.

16. The method of claim 15, wherein the coupling the anti-fuse transistor device to the bit line comprises applying an electric field to a dielectric layer of the anti-fuse transistor device, the electric field having a symmetry based on the first selection transistor and the second selection transistor.

17. The method of claim 15, wherein the coupling the anti-fuse transistor device to the bit line comprises programming the anti-fuse transistor device by breaking down a dielectric layer between the gate of the anti-fuse transistor device and a portion of the substrate between the first selection transistor and the second selection transistor.

18. The method of claim 15, wherein the coupling the anti-fuse transistor device to the bit line comprises generating a current in the bit line, the current comprising:
   a first component flowing through the first selection transistor in a first direction; and
   a second component flowing through the second selection transistor in a second direction opposite the first direction.

19. The method of claim 15, wherein the simultaneously switching on the first selection transistor and the second selection transistor comprises receiving a same signal at a gate of the first selection transistor and a gate of the second selection transistor.

20. The IC device of claim 3, wherein
   a substrate comprises the active area, and
   the conductor overlies a portion of the substrate outside the active area.

* * * * *